(12) United States Patent
Pensala et al.

(10) Patent No.: US 9,559,660 B2
(45) Date of Patent: Jan. 31, 2017

(54) MICROMECHANICAL DEVICES COMPRISING N-TYPE DOPING AGENTS

(75) Inventors: Tuomas Pensala, Helsinki (FI); Antti Jaakkola, VTT (FI); Maria Ganchenkova, Aalto (FI); Mika Prunnila, Helsinki (FI); Jyrki Kiihamaki, Helsinki (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 280 days.

(21) Appl. No.: 13/985,876

(22) PCT Filed: Feb. 17, 2012

(86) PCT No.: PCT/FI2012/050157
§ 371 (c)(1),
(2), (4) Date: Dec. 4, 2013

(87) PCT Pub. No.: WO2012/110708
PCT Pub. Date: Aug. 23, 2012

(65) Prior Publication Data
US 2014/0077898 A1 Mar. 20, 2014

Related U.S. Application Data

(60) Provisional application No. 61/443,725, filed on Feb. 17, 2011.

(30) Foreign Application Priority Data

Feb. 17, 2011 (FI) ...................................... 20115151

(51) Int. Cl.
*H03H 9/24* (2006.01)
*H03H 3/013* (2006.01)
(Continued)

(52) U.S. Cl.
CPC ........ *H03H 9/02448* (2013.01); *B81B 3/0078* (2013.01); *H01L 41/18* (2013.01);
(Continued)

(58) Field of Classification Search
CPC ............ H03H 9/02062; H03H 9/02102; H03H 9/02244; H03H 9/02448; H03H 9/24; H03H 9/2405; H03H 9/2436; H03H 9/2447; H03H 2009/02291; H03H 2009/02322; H03H 2009/02488; H03H 2009/02496; H03H 2009/02503; H03H 2009/02511; H03H 2009/02519; H03H 2009/241; H03H 2009/2442; H03H 3/0072; H03H 3/0076; B81B 3/0078; B81B 3/0081; B81B 2201/0271; Y10T 29/42; H01L 41/18
(Continued)

(56) References Cited

U.S. PATENT DOCUMENTS

| 4,358,745 A | 11/1982 | Keyes |
| 6,707,351 B2 * | 3/2004 | Gorrell ................ H03H 3/0077 257/414 |

(Continued)

FOREIGN PATENT DOCUMENTS

| EP | 2302792 A1 | 3/2011 |

OTHER PUBLICATIONS

Agache, V. et al. "High Q factor plate resonators for ultrasensitive mass sensing applications", Solid-State Sensors, Actuators and Microsystems Conference, 2009, Transducers 2009, Denver, Jun. 21-25, 2009, pp. 1630-1633, E-ISBN: 978-1-4244-4193-8, ISBN: 978-1-4244-4190-7.
(Continued)

*Primary Examiner* — Barbara Summons
(74) *Attorney, Agent, or Firm* — Seppo Laine Oy

(57) ABSTRACT

The invention concerns a micromechanical device and method of manufacturing thereof. The device comprises an
(Continued)

oscillating or deflecting element made of semiconductor material comprising n-type doping agent and excitation or sensing means functionally connected to said oscillating or deflecting element. According to the invention, the oscillating or deflecting element is essentially homogeneously doped with said n-type doping agent. The invention allows for designing a variety of practical resonators having a low temperature drift.

40 Claims, 23 Drawing Sheets

(51) Int. Cl.
    *H03H 9/02*    (2006.01)
    *H03H 3/007*    (2006.01)
    *B81B 3/00*    (2006.01)
    *H01L 41/18*    (2006.01)

(52) U.S. Cl.
CPC ........ *H03H 3/0072* (2013.01); *H03H 3/0076* (2013.01); *H03H 9/2405* (2013.01); *H03H 9/2447* (2013.01); *B81B 2201/0271* (2013.01); *H03H 2009/02503* (2013.01); *H03H 2009/02519* (2013.01); *H03H 2009/241* (2013.01); *H03H 2009/2442* (2013.01); *Y10T 29/42* (2015.01)

(58) Field of Classification Search
USPC ....... 333/186, 187; 257/416; 438/50; 29/594
See application file for complete search history.

(56) References Cited

U.S. PATENT DOCUMENTS

| | | | |
|---|---|---|---|
| 7,145,402 | B2 | 12/2006 | Mattila et al. |
| 7,459,329 | B2* | 12/2008 | Ouellet ............... B81C 1/00666 438/50 |
| 2004/0207492 | A1* | 10/2004 | Nguyen ............... H03H 3/0072 333/199 |
| 2007/0262831 | A1* | 11/2007 | Van Beek .......... H03H 9/02448 333/186 |
| 2007/0296527 | A1* | 12/2007 | Lutz .................. H03H 9/02338 333/186 |
| 2008/0007362 | A1* | 1/2008 | Partridge ................. G01K 7/32 331/176 |
| 2008/0143217 | A1* | 6/2008 | Ho ....................... H03H 3/0076 310/367 |
| 2009/0153258 | A1* | 6/2009 | Lutz ......................... H03B 5/30 331/156 |
| 2011/0089785 | A1* | 4/2011 | Ho ....................... H03H 3/0072 310/314 |

OTHER PUBLICATIONS

Hajjam A. et al. "Sub-100ppb/C temperature stability in thermally actuated high frequency silicon resonators via degenerate phosporous doping and bias current optimization" Electron Devices Meeting (IEDM), 2010 IEEE International San Fransisco, CA, Dec. 6-Dec. 8, 2010, p. 7.5.1.-7.5.4. Published on Jan. 28, 2011.

Hajjam A. et al. "Temperature compensated single-device electromechanical oscillators", MEMS 2011, Cancun, Jan. 23-27, 2011, pp. 801-804.

Hall, John J. "Electronic Effects in the Elastic Constants of n-Type Silicon", Physical Review, vol. 161, No. 3, Sep. 15, 1967.

Ho, G. K. et al. "Micromechanical IBARs: Modeling and Process Compensation", Journal of Microelectromechanical Systems, Jun. 2010, vol. 19, Issue 3, pp. 516-525, ISSN: 1057-7157, doi: 10.1109/JMEMS.2009.2030076, XP011308240.

Koskenvuori, M. et al. "Temperature measurement and compensation based on two vibrating modes of a bulk acoustic mode microresonator", MEMS 2008, Tucson, Jan. 13-17, 2008, pp. 78-81.

Lin, A.T.-H. et al. Electrostatically transduced face-shear mode silicon MEMS microresonator, Frequency Control Symposium (FCS), 2010 IEEE International, Jun. 1-4, 2010, p. 534-538, published on Aug. 23, 2010.

Samarao, A. K. "Passive TCF compensation in high Q silicon micromechanical resonators", 2010 IEEE 23rd International Conference on Micro Electro Mechanical Systems (MEMS), Jan. 24-28, 2010, Wanchai, Hong Kong, pp. 116-119, ISSN: 1084-6999, E-ISBN: 978-1-4244-5763-2.

Samarao, A.K. et al. "Intrinsic Temperature Compensation of Highly Resistive High-Q Silicon Microresonators via Charge Carrier Depletion", School of Eletrical and Computer Engineering, Georgia Institute of Technology, Atlanta, published in 2010 IEEE International Frequency Control Symposium, Jun. 1-4, 2010, pp. 334-339.

\* cited by examiner

MICROMECHANICAL DEVICES COMPRISING N-TYPE DOPING AGENTS

FIELD OF THE INVENTION

The invention relates to micromechanical devices and, in particular, their temperature compensation. In particular, the invention relates to MEMS resonators. The device according to the invention has the features of a micromechanical bulk acoustic wave (BAW) device.

The invention also concerns a method of manufacturing a micromechanical bulk acoustic wave (BAW) device.

BACKGROUND OF THE INVENTION

Widely used quartz crystal based resonators can potentially be replaced by micromechanical, typically silicon-based resonators in many applications. Silicon resonators can be made smaller than quartz resonators and there are a plurality standard manufacturing methods for silicon resonators. However, a problem associated with silicon based resonators is that they have a high temperature drift of the resonance frequency. The drift is mainly due to the temperature dependence of the Young modulus of silicon, which causes a temperature coefficient of frequency (TCF) approx. $-30$ ppm/° C. This causes the resonance frequency to fluctuate due to changes in ambient temperature.

The large intrinsic temperature drift prevents silicon-based resonators from entering the quartz crystal dominated oscillator market. It is, however, known to compensate the temperature dependence in various ways. The prior art solutions include:

Active compensation with a temperature sensor and related electronic control circuitry, but it has not been possible to provide a resonator with sufficiently low temperature drift with low cost technology which would be suitable for mass production applications and would compete with quartz quality. Also, the use of a temperature compensation circuit increases the consumption of energy, which is a significant disadvantage especially in battery operated devices. Further, the compensation circuit tends to increase electric noise in the resonator circuit.

Active compensation by stabilizing the temperature of the resonator with temperature isolation and controlled warming/cooling of the resonator. However, this solution also increases the energy consumption of the device, and makes the device complicated to produce. The temperature compensation circuits are also slow in controlling, and cannot therefore compensate fast or large changes in ambient temperature sufficiently well.

Passive compensation by addition of amorphous $SiO_2$ exhibiting opposite sign of temperature drift to the structure. This, however, leads to a more complex fabrication process and resonator performance trade-off Passive compensation by heavy p-type doping, such as boron doping, compensates strongly for $c_{44}$ characterized shear modes, like the Lamé mode, but less or not at all some other modes, limiting the applicability to quite special modes and excitation geometries in the case of piezoactuation. In particular, extensional modes are not well compensated by p-type doping.

Passive compensation methods are discussed in not yet published Finnish patent applications 20105849 and 20105851 of the same applicant, as well as references cited therein, in particular A. K. Samarao et al, "*Passive TCF Compensation in High Q Silicon Micromechanical Resonators,*" IEEE International Conference on Micro Electro Mechanical Systems (*MEMS 2010*), 2010, pp. 116-119; US 2010/0127596 and U.S. Pat. No. 4,719,383.

An article by A. K. Samarao et al., "*Intrinsic Temperature Compensation of Highly Resistive High-Q Silicon Microresonators via Charge Carrier Depletion*", Frequency Control Symposium (FCS), 2010 IEEE International, 1-4 Jun. 2010, pages: 334-339, discloses a bulk acoustic wave resonator comprising boron-doped (p-doping) silicon resonator element for reducing the temperature drift of the resonator. The boron-doped (p-doping) resonator element comprises, in addition, one or more layers of diffused phosphorus (n-doping) in order to create one or more pn-junction to the resonator element. The pn-junctions forming a depletion region with low charge carrier concentration have the effect that a TCF of $-3$ ppm/° C. could be achieved.

Hajjam et al. "Sub-100 ppb/° C. Temperature Stability in Thermally Actuated High Frequency Silicon Resonators via Degenerate Phosphorous Doping and Bias Current Optimization", IEEE International Electron Device Meeting, December 2010, disclose also the possibility of n-type doping of silicon with phosphorus in order to further improve the TCF. They report a temperature drift of 0.05 ppm/° C. in a thermally diffusion doped silicon resonator. Diffusion doping, however, results in a strong concentration gradient of charge carriers in the resonator and an n-dopant concentration of about $1*10^{19}$ cm$^{-3}$ or higher, which is shown later to be needed for efficient T-compensation, can be created only to a region penetrating to approximately 2 micron thickness from the surface of the device. Achieved concentration levels may be also dependent on the exact geometry of the device, which sets design constraints. Thus, there are severe limits for the design of the resonator with respect to its volume, thickness and availability of resonance modes, for example. For example, bulk acoustic wave modes are not effectively temperature compensated in diffusion doped resonators.

U.S. Pat. No. 4,358,745 discloses a surface acoustic wave (SAW) device having a substrate comprising a thin doped silicon layer carrying surface waves and being allegedly temperature compensated. Modern simulations have, however, shown that the structures described therein can carry only Rayleigh SAW waves and shear horizontal SAW waves which are not well temperature compensated in practice due to strong contribution from non-compensated elastic matrix elements of silicon. In addition, the publication does not disclose any excitation means which could in practice be used to excite a SAW mode to the structure disclosed. Introduction of such means, such as a piezoactive layer on top of the doped layer, would additionally decrease the performance of the device since the comtribution from the piezoactive layer would be very large. Due to these facts, the described structure has never been commercially exploited.

Thus, there is a need for improved and practically feasible semiconductor resonators and other devices.

SUMMARY OF THE INVENTION

It is an aim of the invention to achieve an improved temperature compensated micromechanical device, such as a resonator. In particular, an aim of the invention is to achieve a resonator design which offers more design flexibility. One aim is to provide a resonator structure which can be industrially manufactured in a simple way.

The invention also provides a set new practical designs of temperature compensated resonators for various purposes.

According to one aspect, the device according to the invention comprises an oscillating or deflecting element made of semiconductor material comprising a substantial concentration of n-type doping agent, excitation or sensing means functionally connected to said oscillating or deflecting element. Further, the oscillating or deflecting element is essentially homogeneously doped with said n-type doping agent.

According to the main aspect of the invention, the device is a bulk acoustic wave (BAW) device. Thus, it is adapted to carry bulk acoustic waves and to oscillate in acoustic BAW modes. In such a structure, the oscillating or deflecting element is homogeneously doped throughout its whole thickness.

According to one aspect, the device according to the invention comprises an oscillating or deflecting element made of semiconductor material comprising a substantial concentration of n-type doping agent, excitation or sensing means functionally connected to said oscillating or deflecting element. The oscillating or deflecting semiconductor element can be characterized as a spring or a plurality of springs which have an integral part for the functionality of the device. If the orientation of the spring(s) is such that its spring constant (which is generally a function of elastic matrix elements $c_{11}$, $c_{12}$, $c_{44}$) is mainly dependent on the $c_{11}$-$c_{12}$ term, the temperature variation of the spring constant can be remarkably reduced by n-doping. As the springs are an integral part of the device functionality, the device performance variation as a function of temperature is minimized in this way.

According to one aspect, the device according to the invention comprises an oscillating or deflecting element made of semiconductor material comprising a substantial concentration of n-type doping agent, excitation or sensing means functionally connected to said oscillating or deflecting element and the crystal orientation of the semiconductor material, which is preferably silicon, with respect to the direction of resonance or deflection of the oscillating or deflecting element is chosen to deviate less than 30°, preferably less than 15° from a direction that maximizes the temperature coefficient of the device. According to one embodiment, the crystal orientation is chosen to maximize the temperature coefficient of the device. Examples of the influence of the crystal direction chosen are given later in this document.

According to one aspect, the device according to the device according to the invention comprises an n-doped resonator element and comprising transducer means for exciting a resonance mode to the resonator element. The resonance mode may be one of the following:
  shear mode in a plate resonator element,
  square extensional (SE) mode in a plate resonator element,
  width extensional (WE) mode in a plate resonator element,
  flexural mode in a plate resonator element,
  extensional mode in a beam resonator element,
  flexural mode in a beam resonator element, or
  torsional mode in a beam resonator element.

The present method of manufacturing a micromechanical device comprises
  providing a semiconductor wafer comprising an n-doped, preferably homogeneously n-doped device layer,
  processing the semiconductor wafer to form an element from the n-doped device layer, the element being capable of deflection or oscillation,
  providing excitation or sensing means functionally connected to said element for exciting a resonance mode to the element or sensing the resonance frequency or degree of deflection of the element.

The abovementioned aspects can be implemented as such or in any suitable combination thereof and/or with one or more of the specific embodiments described hereinafter. Some of the embodiments are the subject of dependent claims.

Application areas of the invention comprise for example micromechanical frequency reference crystals, and micromechanical sensors comprising a resonating or deflecting element as an integral part of the sensor. The term deflecting covers movement (e.g. bending, stretching, twisting and turning) in all directions involving loading of the element through its $c_{11}$-$c_{12}$-dependent spring constant.

In the following discussion, we concentrate on an embodiment of the invention in which the oscillating or deflecting element is a resonator element.

According to one embodiment, the concentration of the n-type doping agent in the resonator is at least $1.0*10^{19}$ cm$^{-3}$, preferably at least $1.1*10^{19}$ cm$^{-3}$ and typically at least $1.2*10^{19}$ cm$^{-3}$. Usually, the concentration is less than $10^{21}$ cm$^{-3}$. Thus, there is a strong excess of negative electron charge carriers in the resonator. Above the abovementioned concentration limits it is possible to achieve practical resonators with close to zero TCF. Generally, the concentration limit is lowest for Lamé modes. For other modes, the zero-TCF limit is typically slightly higher.

According to one embodiment, the resonator element is essentially free from p-type doping agents.

According to one embodiment, the resonator element is essentially homogeneously doped with the n-type doping agent. Preferably, the doping concentration has local variation of no more than 10% within the resonator element.

According to one embodiment, the resonator element comprises a crystal grown by Czochralski method, in which the n-type doping agent is present already in the crystal growing stage. According to another embodiment, the resonator element comprises a crystal which is epitaxially grown with the n-type doping agent is present already in the growing stage. Both these methods result in a homogeneous doping of the crystal.

The resonator can be made of silicon and the doping agent can be phosphorus, antimony or arsenic, for example.

According to one embodiment, the resonator element comprises a homogeneously doped silicon plate or beam having a thickness of at least 4 μm and at least one lateral dimension of at least 50 μm, and the transducer element is adapted to produce a shear, square extensional, width extensional or flexural plate bulk acoustic wave mode or extensional, flexural or torsional beam bulk acoustic wave mode to the resonator element.

According to one embodiment, the minimum dimension of the resonator element is at least 5 μm, typically at least 7 μm. Relatively thick resonators like this cannot in practice be homogeneously doped by diffusion doping. In the case of plate resonators, the minimum dimension is typically the thickness.

According to one embodiment, the present device is adapted to be actuated without bias current using non-thermal actuation methods. This can be achieved with piezoelectric thin film excitation means or electrostatic excitation means, as will be described below in more detail.

Considerable advantages are obtained by means of the invention. It has been experimentally shown by the inventors that resonators practically no temperature drift and even overcompensation of resonators can be achieved with n-doped resonators according to the invention. Such behaviour has not been demonstrated with the doping levels achieved with p-doping this far. In addition, p-doped resonators exhibit temperature compensation effect only when driven in a resonance mode dependent strongly on the $c_{44}$ shear stiffness term, which restricts the applicability of p-doping for temperature compensation to a relatively narrow set of resonance modes. As concerns known resonators with regions of n-type doping, the TCF is still relatively low. Although in many applications a TCF close to zero is ultimately desired, solutions are needed which can offer an even higher TCF which can then be traded off with other design parameters. The present invention responds to this need.

In the case of n-doped resonators the resonance modes whose frequency is dependent mainly on the term $c_{11}$-$c_{12}$, where the $c_{11}$ and $c_{12}$ are the elastic matrix elements, can be temperature compensated. A set of $c_{11}$-$c_{12}$ characterized resonance modes and geometries is presented in this document in detail. In general, the invention can be applied e.g. to shear-mode resonators such as a plate resonator in the Lamé mode and to beams oscillating in extensional flexural and torsional resonance modes, and to more general combinations thereof. Thus, the aim of improved flexibility is met with the invention.

Compared with resonators having a plurality of pn-junctions, the present design is easier to manufacture. No pn-junctions are needed in order to achieve the temperature compensation effect. In addition the temperature compensation effect is more remarkable with strong n-doping: positive or zero TCF has not been demonstrated based on pn junctions.

Compared with diffusion doped non-homogeneous resonators, the invention has also great advantages. Diffusion doped resonators which have springs that make up large (thickness >2 μm or smallest cross-sectional dimension >4 μm) continuous volumes cannot be homogeneously doped with the diffusion method. Such devices are desirable in many contexts. Examples are:

A. BAW MEMS resonators such as plate resonators that have a relatively large volume (thickness >=10 μm and/or lateral dimensions larger than 50 μm). Large volume of the resonator, and consequently a large volume of the spring that needs to be n-doped, is needed for good energy storage capacity, which leads to low noise (signal-to-noise ratio) of the device. Examples of this type of MEMS resonators, which can be implemented using the present invention, are the SE-mode, Lame-mode and width-extensional plate resonators.

If, on the other hand, the plate was perforated with a dense array of holes in such a way that the distance from any point of the device to the surface would be less than 2 μm, the required grid would need to be very dense and the holes would have to be very small in diameter. In addition, the grid of holes (especially when dense) could perturb device operation (leads for example increased losses in a resonator), could make the device more sensitive to manufacturing inaccuracies and would be a severe process complication.

B. A spring with larger dimensions is more tolerant to manufacturing inaccuracies. For example, assume that the inaccuracy of the process for defining a spring width is 0.1 μm. The relative error of the spring constant of a nominally 2 μm-wide spring would be 5%. A resonator based on such a spring would have a frequency inaccuracy of 25 000 ppm. On the other hand, with the same processing inaccuracy, a resonator based on a 20 μm-wide spring would result only 2 500 ppm frequency inaccuracy.

Compared with SAW resonators, such as that disclosed in U.S. Pat. No. 4,358,745, the present BAW device has a completely different principle of operation and, what is most important, can be realized in practice without losing temperature compensation. It should be noted that extending the doping to deeper layers of a SAW resonator would not make sense because of surface waves used and in practice would make the device inoperative because electrical shunt coupling would increase and oscillation would not take place.

From fabrication point of view, the ability to use a homogeneously pre-doped wafer is a process simplification, because suitably doped wafers can be purchased from a wafer manufacturer and the standard MEMS process flow needs not be changed because of a separate doping step.

The present invention has been demonstrated both theoretically and experimentally. Theoretical calculations show that the temperature drift of $c_{11}$-$c_{12}$ characterized modes can be affected by addition of free electrons by heavy n-type doping. Experimentally have been demonstrated i.a. well temperature compensated square extensional resonator elements and even overcompensated Lamé-mode resonator elements. The term "overcompensated" means that the resonator element as such, without additional elements (e.g. layers necessary for the transducers or additional transducer blocks) coupled to it exhibits a positive temperature drift, i.e. TCF of >0, at 25° C.

It has also been found out by the inventors that compared with traditional p-doped silicon resonators, there is even stronger temperature compensation effect when silicon is strongly n-doped with phosphorus. Similar behavior can be expected with other n-dopants, too, since the theory (see the end of the description), which agrees well with experimental results, is independent of the specific element used as the n-dopant. It has been shown that by means of the invention, even the manufacture of overcompensated (thus, TCF >0) silicon resonators is practically possible. This, for its part, offers new possibilities for the development of different kinds of new resonators for various purposes, for which only quartz-based resonators have been thinkable this far.

Particularly important embodiments of the invention comprise a temperature compensated square extensional resonance mode which can readily be actuated both piezoelectrically and electrostatically and also has other desirable properties. Of importance is also purely $c_{11}$-$c_{12}$ characterized Lamé mode having a positive temperature drift (or TCF), which indicates that there is room to overcompensate silicon in order to design the temperature drift of a multi-material (such as thin film piezoactuated) device to close to zero.

A close to zero TCF behavior of a beam resonator can be achieved, i.a., by
i) optimizing the doping concentration so that the TCF maximum is close to zero, or
ii) adding additional dopants, possibly of p-type, to the crystal, or
iii) adding additional resonator parts which change the overall TCF of the resonator close to zero, or
iv) accurately setting the resonator element direction to an angle deviating from an optimal direction with respect to the crystal, or
v) combination of the above.

The term "temperature compensated" refers to the fact the temperature coefficient of frequency (TCF) of the resonator is higher than that of a resonator made of silicon crystal with standard doping levels, that is, higher than about −30 ppm/° C., preferably higher than −20 ppm/° C.

The term "close to zero" (TCF or temperature drift) means a TCF range of −5-+5 ppm/° C.

The expressions that the frequency of a particular resonance mode is characterized or dominated by matrix element terms ($c_{11}$-$c_{12}$) means that no more than 20% of frequency contribution come from other terms (e.g. the $c_{44}$ term).

Crystal directions are denoted with the bracket notation, e.g. [100]. By this notation any equivalent direction is meant: e.g. [100] is equivalent to [010] or [001].

When elastic matrix elements $c_{11}$, $c_{12}$ and $c_{44}$ are referred to in the text it is assumed that these elements are given in the [100] crystal axes. For example, with this definition the silicon elastic matrix elements are approximately ($c_{11}$, $c_{12}$, $c_{44}$)=(166, 64, 80) Gpa.

The present invention can be utilized in various kinds of oscillator, clock and timer units which may further form part of electronic devices, such as portable electronic devices, in particular wireless devices.

In the following, embodiments and advantages of the invention are discussed in more detail with reference to the attached drawings.

BRIEF DESCRIPTION OF THE DRAWINGS

FIG. 7: Plate resonator in a Lamé/face-shear mode
FIG. 8: Plate resonator in a square extensional mode
FIG. 9: Plate resonator in flexural modes
FIG. 10: Plate resonator in a width extensional mode
FIG. 11: Beam resonator in length-extensional 1$^{st}$ order mode
FIG. 12: Beam resonator in length-extensional 3$^{rd}$ harmonic mode
FIG. 13: Beam resonator in an in-plane flexural mode
FIG. 14: Beam resonator in an out-of plane flexural mode
FIG. 15: Beam resonator in a torsional mode

DETAILED DESCRIPTION OF EMBODIMENTS

Figures 1A, 1B:
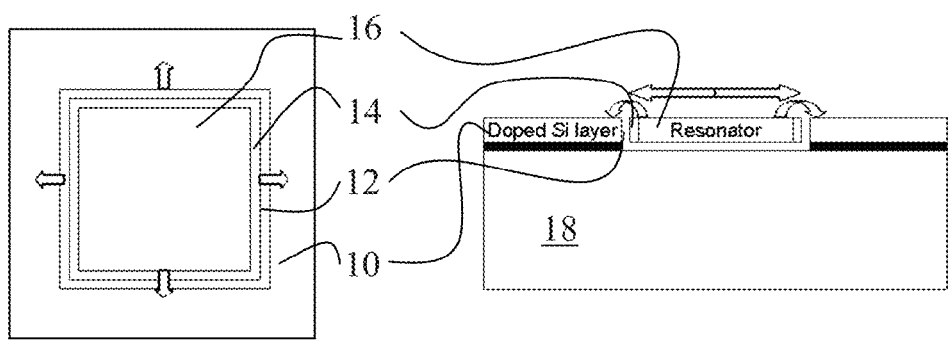
FIGS. 1a and 1b illustrate top and cross section views of electrostatically actuated plate resonators fabricated on SOI or CSOI wafer.

According to one aspect thereof, the present in invention presents the idea and applications of heavy n-type (e.g. by phosphorous) doping of silicon for compensating for the temperature drift of resonance frequency of silicon MEMS resonators. As will be shown below, the invention can be applied for
  resonators with various geometries, such as beam resonators and plate resonators and their combinations,
  various wave types, such as longitudinal and shear bulk acoustic waves (BAWs), and
  various resonance modes, including torsional, flexural and extensional modes.

Many specific examples of these variations are given below after a short discussion of general aspects of n-doping, applicable to several or all of the specific examples.

The temperature drift of silicon with standard doping levels, if no special measures taken, is in the order of −30 ppm/° C. According to typical embodiments of the invention, the temperature drift of the n-doped silicon resonator is −20-+20, in particular −5-+5 ppm/° C., depending i.a. on the doping concentration, crystal orientation, modeshape, geometrical design and interfering material structures of the resonator. It is common that TCF curves are determined by fitting an N-order (typically N=3) polynomial function to measured temperature drift data at the temperature of 25° C. Unless otherwise mentioned, the temperature drift (or TCF) values cited herein are given at 25° C. The values may differ from that in other temperatures due to nonlinearity of the temperature/frequency curve, which may occur, as will be discussed later in more detail.

According to one embodiment, the resonator element comprises an n-doped silicon crystal essentially free (within normal purity levels) from p-type doping agents, yielding a TCF of −3 ppm/° C. or higher.

According to one embodiment, the n-type doping is homogeneous within ordinary manufacturing tolerances throughout the resonator thickness. Thus, there are no interfaces of differently behaving materials inside the resonator element.

The experimental and theoretical investigation described in the following shows that by n-type doping the compensation of modes characterized by mainly by the $c_{11}$-$c_{12}$ stiffness term, in contrast to previously known modes characterized by $c_{44}$ stiffness term and temperature compensated by p doping.

According to one embodiment, the resonator element comprises a silicon crystal doped with phosphorus to a relatively heavy doping concentration of $10^{18}$ ... $10^{20}$ cm$^{-3}$. Such concentration is sufficient for the manufacture of close to zero (TCF ≥−3 ppm/C) temperature drift resonators operating in the square extensional (SE) plate mode dominated by the $c_{11}$ stiffness constant. Such concentration is also sufficient for manufacturing close to zero (TCF ≥−3 ppm/° C.) temperature drift resonators operating in the $c_{11}$-$c_{12}$ characterized Lamé mode, with the additional possibility to achieve TCF >0 ppm/C in order to account for the negative temperature drift effect of additional thin film layers such as the electrodes and the piezolayer.

The resonator element can comprise a crystal grown, for example, epitaxially or by the Czochralski method. Suitable methods are presented e.g. in *Handbook of Semiconductor*

*Silicon Technology*, Edited by: O'Mara, W. C.; Herring, R. B.; Hunt, L. P. © 1990 William Andrew Publishing/Noyes.

Actuation of the Resonator

The micromechanical resonator according to the invention can be actuated with transducer means known per se. According to one embodiment the transducer means comprise a piezoelectric actuator element. According to another embodiment, the transducer means comprise electrostatic actuator means.

FIGS. 1a and 1b show the basic design of an electrostatically actuated MEMS resonator manufactured on a silicon substrate 18. The device layer on top of the substrate comprises a resonator element 16 separated from the surroundings, i.e. electrode layer 10, of the device layer and from the substrate by a gap 12. Anchors (not shown) hold the resonator element 16 in place. On at lateral sides of the resonator element 16, there are electrodes 14. When an alternating actuation voltage is coupled over the gap 12 from the electrode layer 10 to electrodes 14, the resonator element 16 can be set to oscillate.

Figures 2A, 2B:
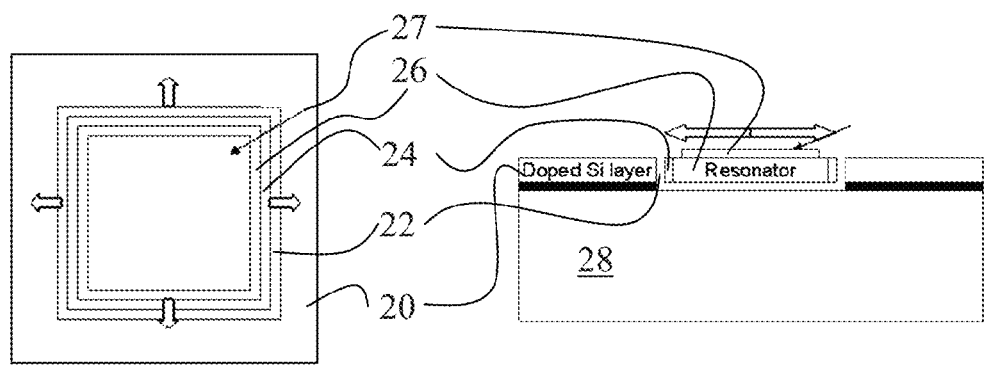
FIGS. 2a and 2b illustrate top and cross section views of piezoelectrically actuated plate resonators fabricated on SOI or CSOI wafer.
Figure 3A:
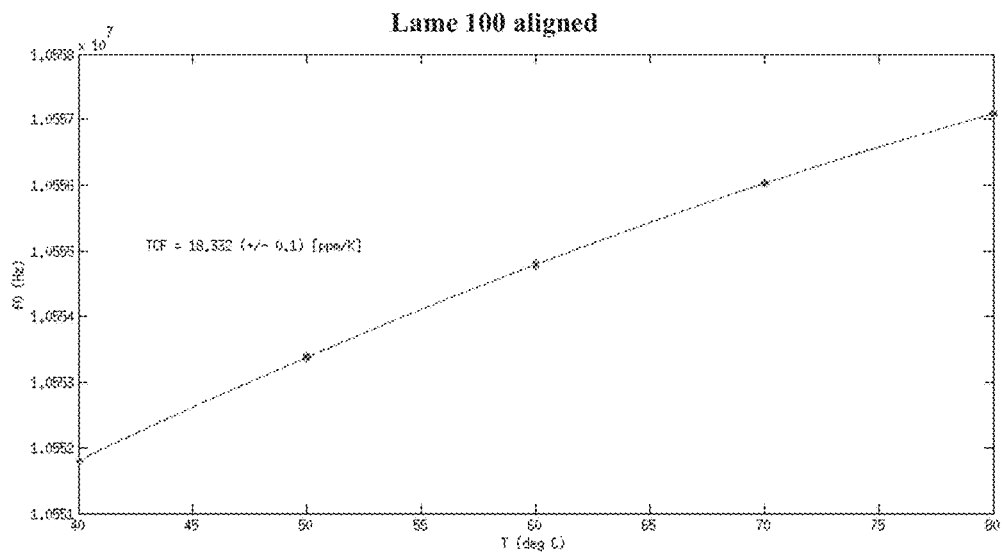
FIG. 3 shows the thermal dependency of the Lamé mode frequency, when the plate resonator is aligned in such a way that the plate sides coincide with the [100] directions.
Figure 3B:
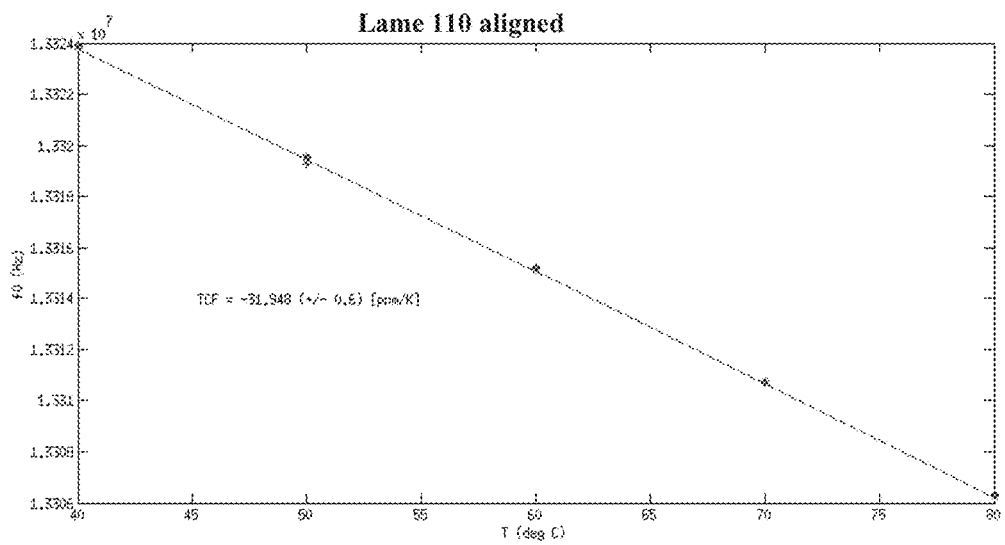
Figure 4A:
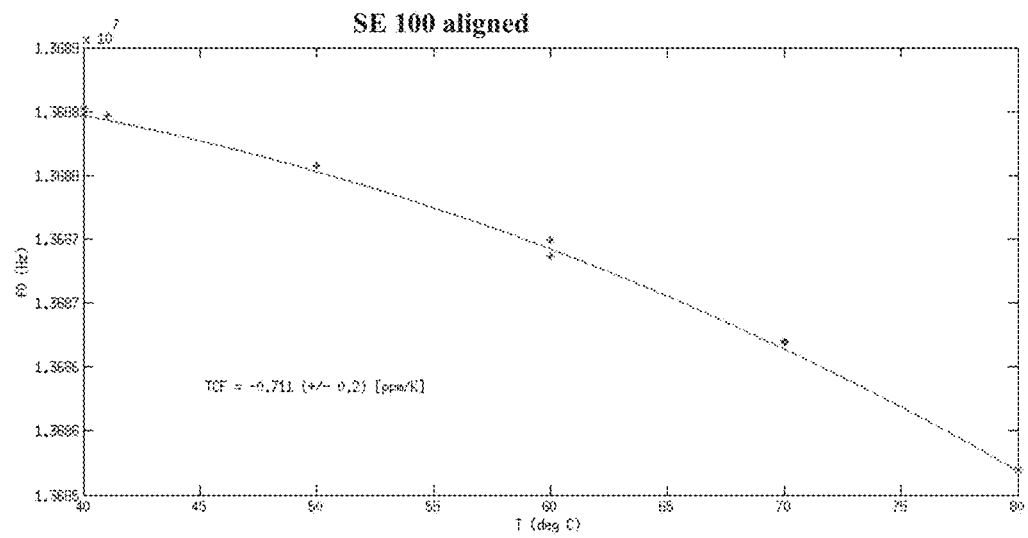
FIG. 4 shows the thermal dependency of the SE mode frequency, when the plate resonator is aligned in such a way that the plate sides coincide with the [100] directions.
Figure 4B:
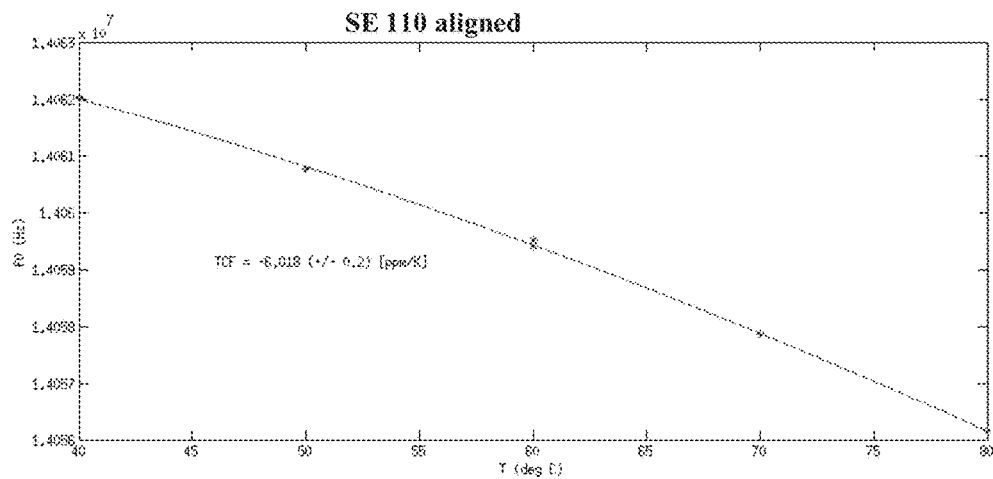

FIGS. 2a and 2b show the basic design of a piezoelectrically actuated MEMS resonator manufactured on a silicon substrate 28. The resonator element 26 is provided with a superimposed piezoelectric layer 27. By applying a voltage over the piezoelectric layer 27, e.g. from a conducting electrode (not shown) arranged on top of it to the resonator element itself, the piezoelectric layer subjects a force also to the resonator element 26.

The present invention can generally be applied in both electrostatically and piezoelectrically actuated resonators.

Of particular importance is a temperature compensated square extensional (SE) mode resonator that can be easily excited using a piezoelectic layer and an electrode layer deposited on top of the n-doped resonator element. As shown below, it has been observed that the SE mode has a close to zero TCF (−1 ppm/° C.). The SE mode can be excited electrostatically as well.

According to one embodiment, the resonator comprises an n-doped resonator element (TCF >0) and a piezoelectric layer (for example AlN) and electrode layer so as to form a piezoactivated MEMS resonator. The piezoelectric layer and electrode layer are known to have a negative TCF. However, the overall TCF of the resonator is close to zero because of overcompensation of the TCF of the resonator element as such. This arrangement is particularly suitable for temperature compensated SE mode resonators.

Figure 5:
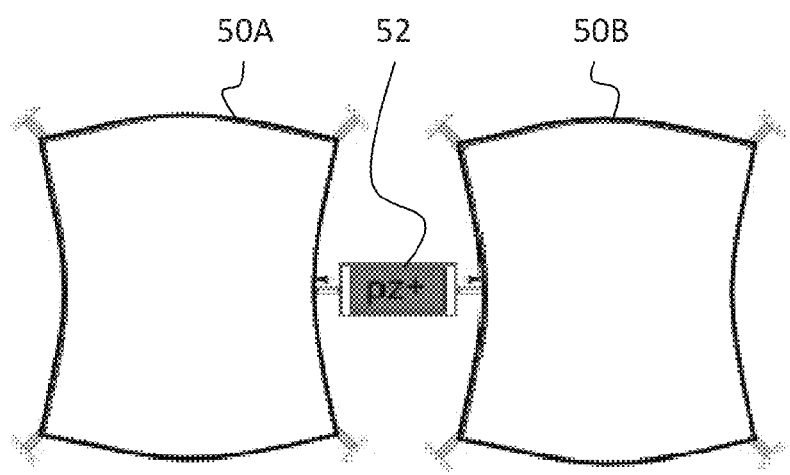
FIG. 5 shows a piezoelectrically actuated Lamé resonator array.

With reference to FIG. 5, the Lamé mode can also be excited using a piezoelectric actuator, for example, as disclosed in FI 20105849 by providing at least two resonator elements 50A, 50B laterally with respect to each other as an array and at least one piezoelectric transducer element 52 between the resonator elements 50A, 50B and coupled to the resonator elements. Other plate resonator modes within the scope of the present invention, like the Face-Shear mode or the Wine glass mode can be excited similarly, too.

According to one embodiment the resonator comprises an array of overcompensated (TCF >0) resonator elements 50A, 50B and an undercompensated piezoelectric actuator 52 coupled to the resonator elements 50A, 50B. The overall TCF of the resonator is thus between the TCF's of its individual components and may be designed to be close to zero.

In the example of FIG. 5, there is shown a two-plate Lamé resonator array. However, as extensively discussed in FI 20105849, the relevant contents of which are incorporated herein by reference, the array can be two-dimensional and comprise a plurality of resonator plates and piezotransducers in a variety of geometries.

Resonator Geometry

According to one embodiment, the resonator element is a beam. The term "beam" generally refers to resonator elements whose in-plane aspect ratio (length vs. width) is at least 5. Typically, the aspect ratio is at least 10.

According to one embodiment, the resonator element is a plate. The plate can be rectangular. For example, it may be a square plate. The plate can also be a polygonal, circular or elliptical. The aspect ratio of a plate (any lateral dimension vs. thickness) is greater than 5.

Depending on the desired resonance mode and level of temperature compensation, the crystal orientation of the resonator is varied with respect to its side orientations, anchoring points and/or actuation means. In the following, the preferred resonance geometries and resonance modes are discussed in the theoretically most optimal crystal orientation, i.e. orientation maximizing the TCF. However, as will be discussed with reference to FIG. 6, deviation from this optimal orientation may be utilized for adjusting the TCF.

The following discussion is divided into paragraphs according to the geometry of the resonator element. First, resonators comprising an essentially two-dimensional plate are discussed. Then, essentially one-dimensional beam resonators are discussed. Finally, some generalizations of the resonators are introduced and more complex geometries and variations taking advantage of the invention are briefly discussed.

Anchoring of the resonators can be carried out at any suitable location allowing the desired resonance mode to emerge into the resonator element. Typically, the anchors are intended not to significantly contribute to the operation of the resonance element and are not considered to be part of the resonance element. However, as will be discussed later, there are some special designs in which the anchors are designed to be beams that have a considerable effect on the resonance properties and, in particular, TCF of the resonator. In this case, the anchors are part of the resonator element.

Plate Resonators

Shear Mode Plate Resonators

A Lamé mode excited to a square silicon plate, in which the crystal orientation in the silicon wafer is (100) and the plate sides are oriented along [100] directions, is an example of a pure shear mode resonator which can take full advantage of n-doping. In this configuration the resonance frequency of a Lamé mode is proportional to $\sqrt{c_{11}-c_{12}}$.

Figure 7A:
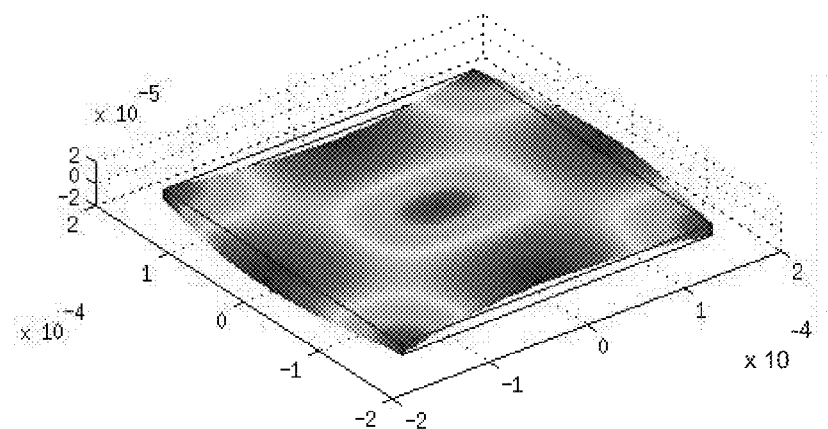
FIGS. 7-15 illustrate exemplary modeshapes taking advantage of n-doping for adjusting the temperature drift, and the dependency of respective simulated TCF values on relevant design parameters.

As an example, the Lamé modeshape of a plate having dimensions (length×width×height) of 320 μm*320 μm*10 μm is illustrated in FIG. 7a. The Lamé mode appears at 10 MHz.

Figure 7B:
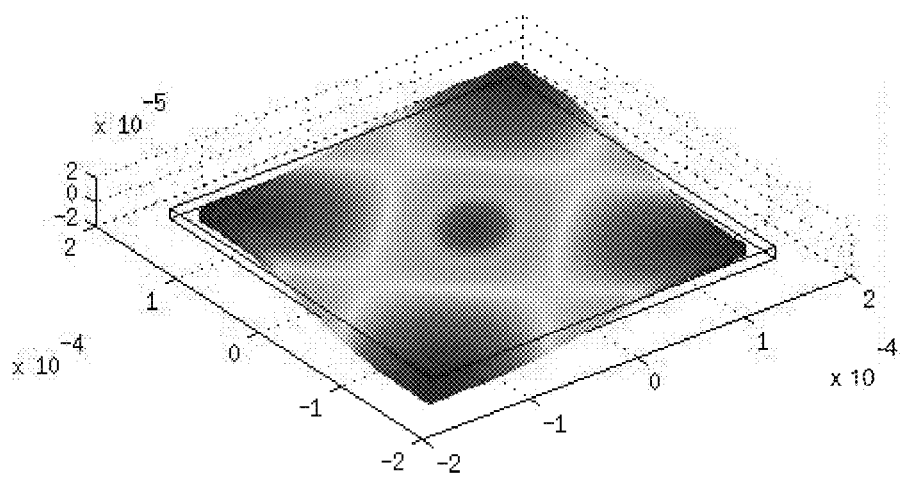

In addition to this basic Lamé modeshape, also higher-order variants of the Lamé mode are covered by the invention. The first order mode is comprised of two diagonally propagating shear waves in a square plate. In higher order modes this condition is satisfied in each square subplate the square plate is virtually divided in. Higher order Lamé modes are more extensively discussed in FI 20105849. A shear wave of similar character is excited to a plate resonator, which is rotated 45 degrees within the plane of the resonator. This mode is called the face-shear mode, and it is of almost pure shear character. The mode shape of the face-shear mode is shown in FIG. 7b. The resonance frequency is 9 MHz.

Finite element model simulations show that when a plate is rotated within the (100) plane the mode gradually changes from Lamé mode to face-shear mode, and the resonance frequency is simultaneously decreased from 10 MHz to 9 MHz. The linear TCF for various n-dopant concentrations can be calculated using FEM simulations and stiffness matrix element temperature sensitivities from theory.

Figure 7C:
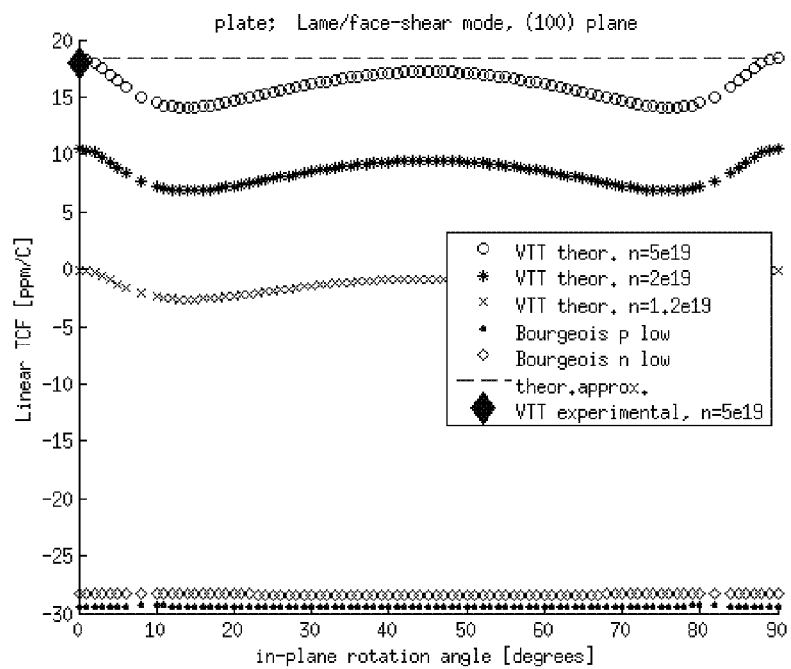

The evolution from the Lamé mode TCF to the face-shear mode TCF as the plate is rotated within (100) plane is shown in FIG. 7c. 0/90 degrees in-plane rotation angle corresponds to a plate with sides aligned with the [100] directions: at this orientation the Lamé mode occurs. At 45 degrees rotation angle the sides are aligned with the [110] directions and the face-shear mode appears. At intermediate angles the mode gradually transfers from Lamé mode to face-shear mode.

Figure 7D:
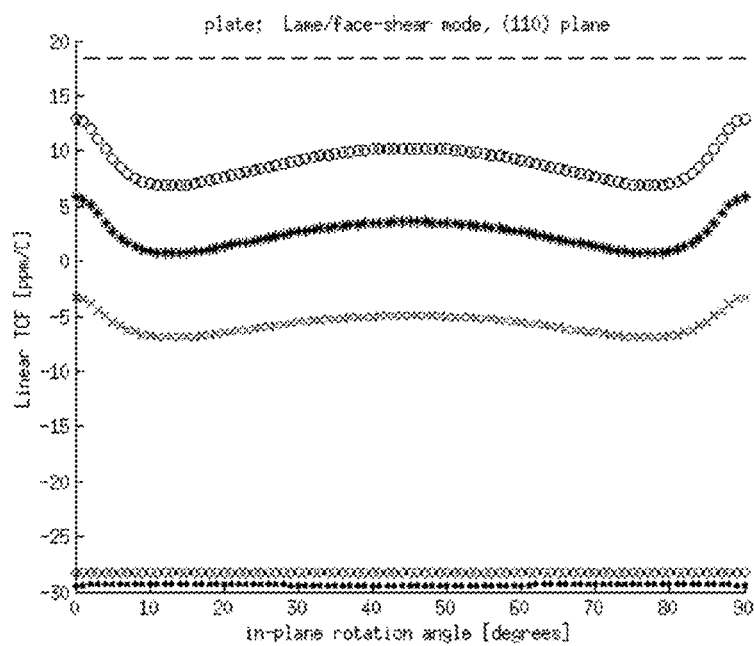

In (110) plane modes that are similar to the above mentioned Lame/face-shear modes can be observed, but they are not as pure as in (100) plane in terms of their sqrt($c_{11}$-$c_{12}$) dependency; hence we refer to these as pseudo-Lamé mode and pseudo face-shear mode in the following. This is because (110) plane is less symmetric than the (100) plane. At 0/90 degrees in-plane rotation one side of the plate is aligned along [100] while the other is oriented along [110]. In the same manner, at 45 degrees in-plane rotation angle the diagonals are oriented along [100] and [110]. FIG. 7d shows the TCF values for the pseudo-Lamé mode (0/90 degrees in-plane rotation), pseudo face-shear mode (45 degrees) and the "mixture" modes at intermediate angles.

The TCF values in FIGS. 7c and 7d have been calculated by FEM simulation: the sensitivity of the resonance frequency with respect to elastic matrix elements $c_{11}$, $c_{12}$ and $c_{44}$ has been extracted from modal simulations and the linear TCF values have been calculated with various n-dopant concentrations using the elastic matrix element temperature sensitivities from the theory (data points labeled with "VTT theor."). Data points labeled with "Bourgeois n low"/"Bourgeois p low" are reference curves that represent silicon with relatively weak n-dopant/p-dopant concentration (see C. Bourgeois et al., "Design of resonators for the determination of the temperaturecoefficients of elastic constants of monocrystalline silicon," in Frequency Control Symposium, 1997, Proceedings of the 1997 IEEE International, 1997, 791-799) (corresponding Si resistivities are 4 Ohm*m and 0.05 Ohm*m for "Bourgeois p low" and "Bourgeois n low", correspondingly). A constant contribution of +1.3 ppm/° C. from thermal expansion has been assumed for all data (see chapters "Theoretical model for TCF of a resonator" and "Theoretical model for the stiffness matrix element temperature sensitivities"). The given description of the calculated data concerns any data plots of the similar type in the treatment below unless stated otherwise. In the FIGS. 8a and 8b the line labeled with "theor. approx." is the calculation for an ideal shear mode, whose frequency is proportional to sqrt($c_{11}$-$c_{12}$); elastic matrix element temperature sensitivities from theory with n-dopant concentration n=5*10$^{19}$ cm$^{-3}$ have been used. Experimental data point is shown in FIG. 7c with legend "VTT experimental, n=5e19".

Following observations can be made from the data in FIGS. 7c and 7d:

The TCF for simulated Lamé mode coincides with the "theor. approx." curve, which confirms the validity of the simulation; the form of Lamé mode resonance frequency is analytically known and the frequency is proportional to sqrt($c_{11}$-$c_{12}$).

With n-dopant concentration n=5*10$^{19}$ cm$^{-3}$ the Lamé-mode, the face shear-mode and the modes at intermediate angles are overcompensated with TCF >~+13 ppm/° C. For n-dopant concentration n=2*10$^{19}$ cm$^{-3}$ the same holds with TCF>~+6 ppm/° C.

The concentration at which TCF is zero for the Lamé mode is approximately n=1.2*10$^{19}$ cm$^{-3}$.

The experimental data point coincides well with the simulated data.

In the (110) plane the quasi-Lamé, quasi face-shear modes and the modes at intermediate angles have TCFs above zero for n=5*10$^{19}$ cm$^{-3}$ and n=2*10$^{19}$ cm$^{-3}$, although due to lack of symmetry the within the (110) plane the modes are not pure shear modes.

The TCF of any of the modes can be zeroed by selecting the concentration level suitably at a value n<2*10$^{19}$ cm$^{-3}$.

The typical silicon TCF of approximately −30 ppm/° C. is observed with relatively low n- or p-doping.

The Lamé mode is important because its temperature drift can be overcompensated with well realizable dopant levels. Experimentally it has been shown that a TCF of even +18 ppm/° C. can be achieved in such resonator.

The invention is not limited to simple square plate Lamé mode plate resonators, but also more complex variants which can be theoretically divided into subsquares, can be realized. The principle is the same as that more extensively discussed in the Finnish patent application No. 20105849 of the same applicant.

Square Extensional (SE) Mode Plate Resonators

Figure 8A:
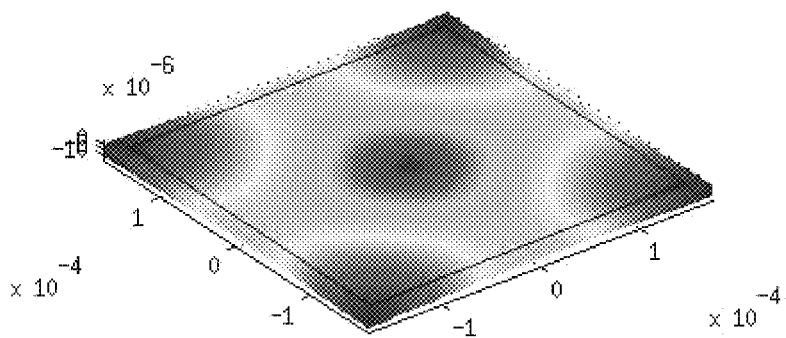

SE mode excited to a square silicon plate, in which the crystal orientation in the silicon wafer is (100) and the plate sides are oriented along [100] directions, represents an example of an extensional mode resonator which can take advantage of n-doping. The SE mode at 13 MHz is illustrated in FIG. 8a for a similar plate resonator as was discussed in the previous example of a Lamé or face-shear mode resonator.

Figure 8B:
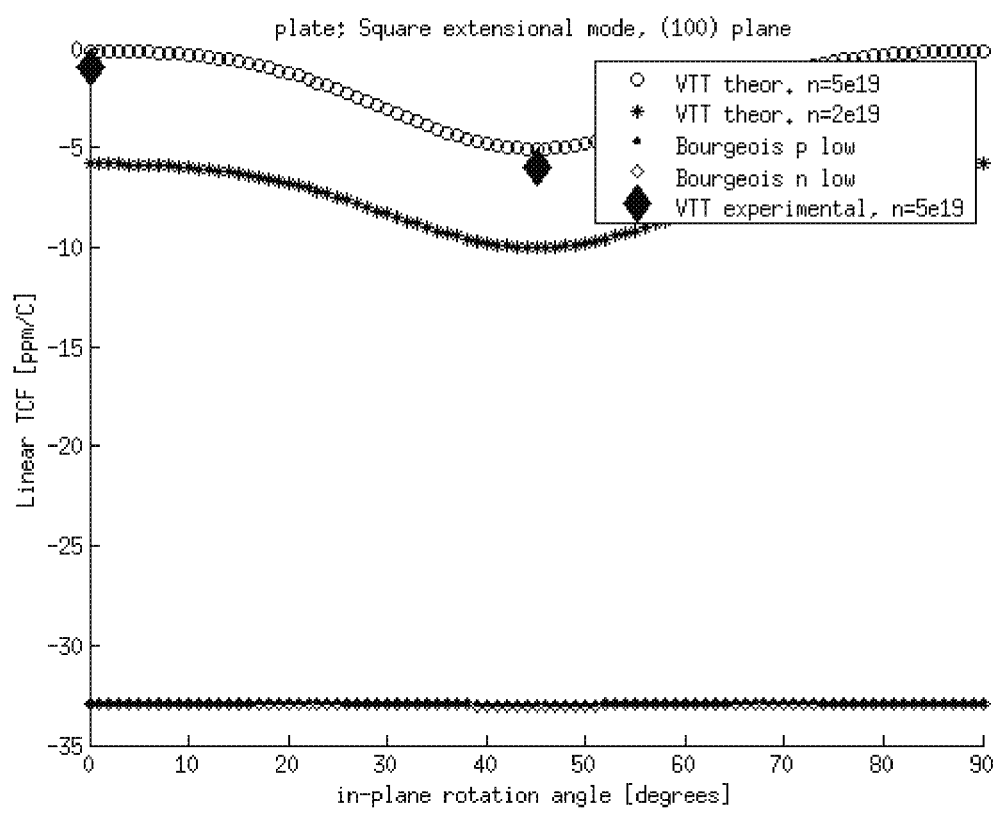

FIG. 8b illustrates the calculated temperature coefficients of the SE mode, when the plate resonator is rotated within the (100) plane. 0/90 degrees in-plane rotation angle corresponds to plate sides aligned with [100] directions, 45 degrees corresponds to side alignment with [110].

Observations are:

The TCF attains its highest value for plate with sides aligned with [100] directions.

Experimental data agrees reasonably well with simulated data. The observed offset of approximately −1 ppm/C between experiment and simulation can be attributed to corner anchors. (Fine-tuning of the system with anchors or a central hole in the resonator element are discussed later.)

Again, with low level of p- or n-doping the typical silicon TCF of about −30 ppm/° C. is reproduced.

Figure 19:
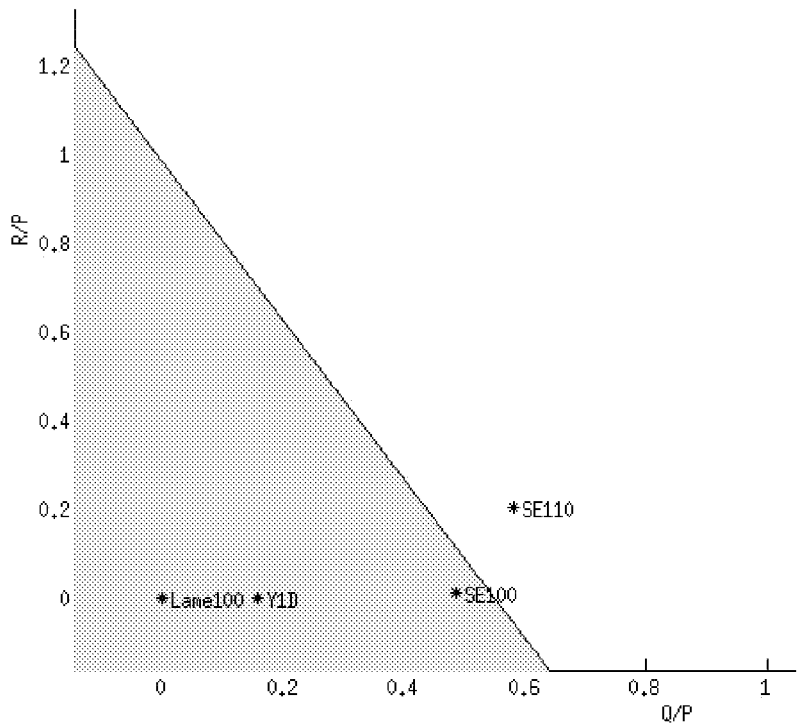
FIG. 19 shows the location of two square extensional modes, a Lamé mode and a flexural beam mode in a (Q/P, R/P)-plane.

Point labelled as "SE100" in FIG. 19 indicates that the SE mode of a plate whose sides are aligned with the [100] directions fullfills the temperature compensation criterion. Similar plate with alignment with [110] does not meet the criterion.

Flexural Mode Plate Resonators

Flexural saddle modes that exist in square-shaped plate resonators are strongly $c_{11}$-$c_{12}$ characterized modes, when aligned suitably with the crystal axis. Saddle modes are characterized by the saddle surface shape of the resonance mode, which results in two intersecting nodal lines (sets of locations with no displacement) through the resonator body (for more discussion on saddle modes, see FI 20105851). Two types of saddle modes in plates of dimensions (width*length*thickness) of 320 μm*320 μm*10 μm are shown in FIGS. 9a and 9b.

Figure 9A:
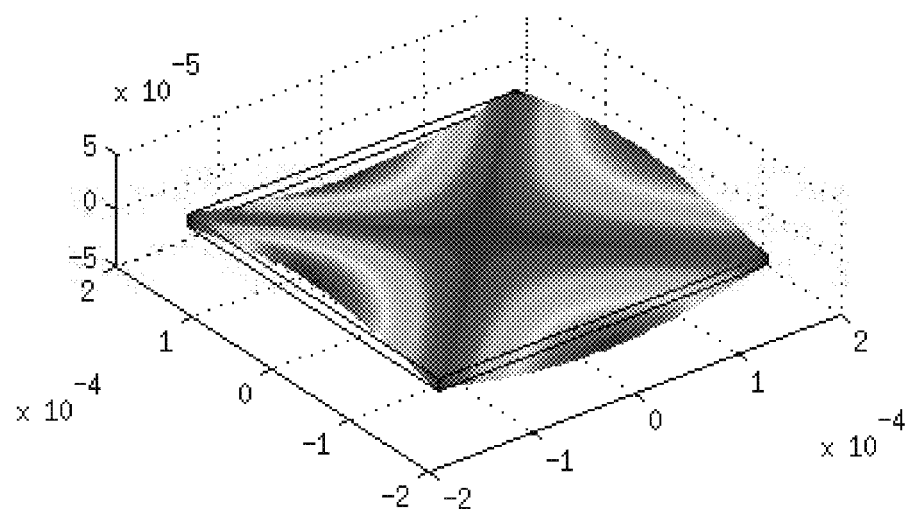
Figure 9B:
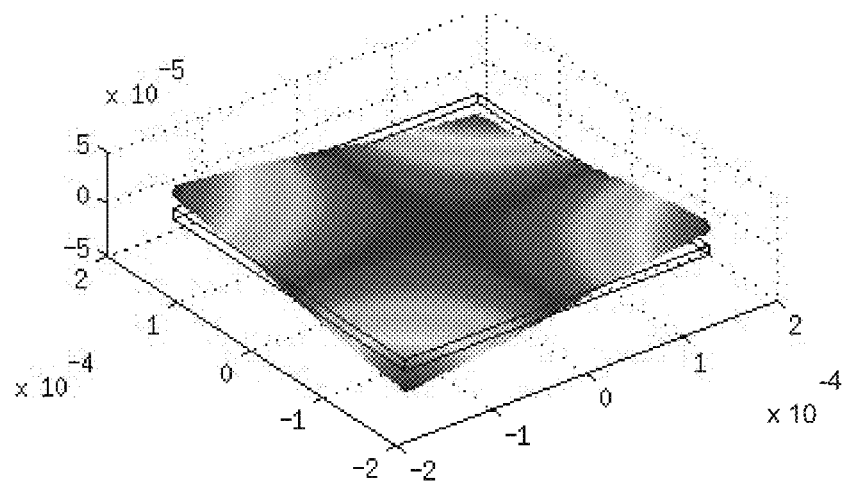

According to simulations, saddle mode of FIG. 9*a* is has maximal (above zero, assuming sufficiently high n dopant concentration (>1.2*10$^{19}$/cm$^3$)) TCF when
  the plate is fabricated to (100) plane and the plate sides are aligned to [100] directions or
the plate is fabricated to (110) plane and one side of the plate is along [100] direction and other side is along [110] direction Saddle mode of FIG. 9*b* is has maximal (above zero) TCF when
  the plate is fabricated to (100) plane and the plate diagonals are aligned to [100] directions, or
  the plate is fabricated to (110) plane and one side of the diagonals is along [100] direction and other diagonal is along [110] direction.

As discussed in more detail in FI 20105851, saddle modes are not restricted to rectangular plates, and modes of similar character exist, e.g., in disk-shaped plates as well.

In addition to the saddle modes discussed above, other flexural (bending) resonance modes, which can be temperature compensated by n-doping, can be excited to a plate resonator. These modes can be can be characterized as being similar modes as the out-of-plane flexural modes of a beam resonator (discussed later in a separate section). A plate resonator can be described as a beam whose lateral dimensions (height, width) are close or equal to each other.

Width Extensional Plate Resonators

Figure 10A:
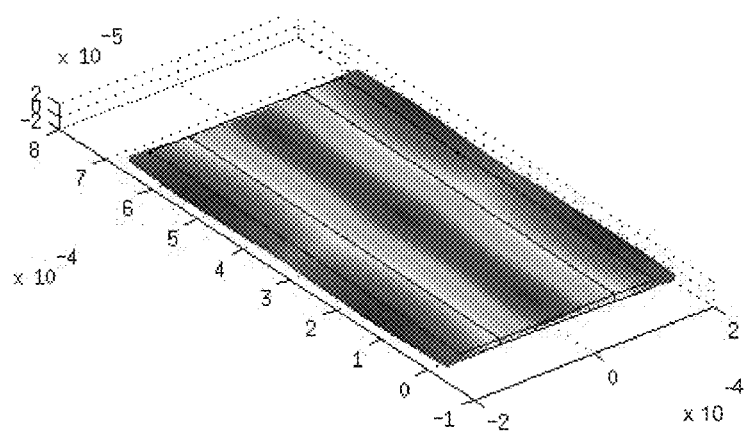

It turns out that when the length of one of the sides of a square plate resonator is varied, the mode shape changes gradually from the square extensional mode (FIG. 8*a*) to a width extensional (WE) mode (FIG. 10*a*), a width extensional mode of a 320*680*10 µm$^3$ resonator at 12 MHz, where the in-plane extension occurs in the direction defined by the smaller side.

Figure 10B:
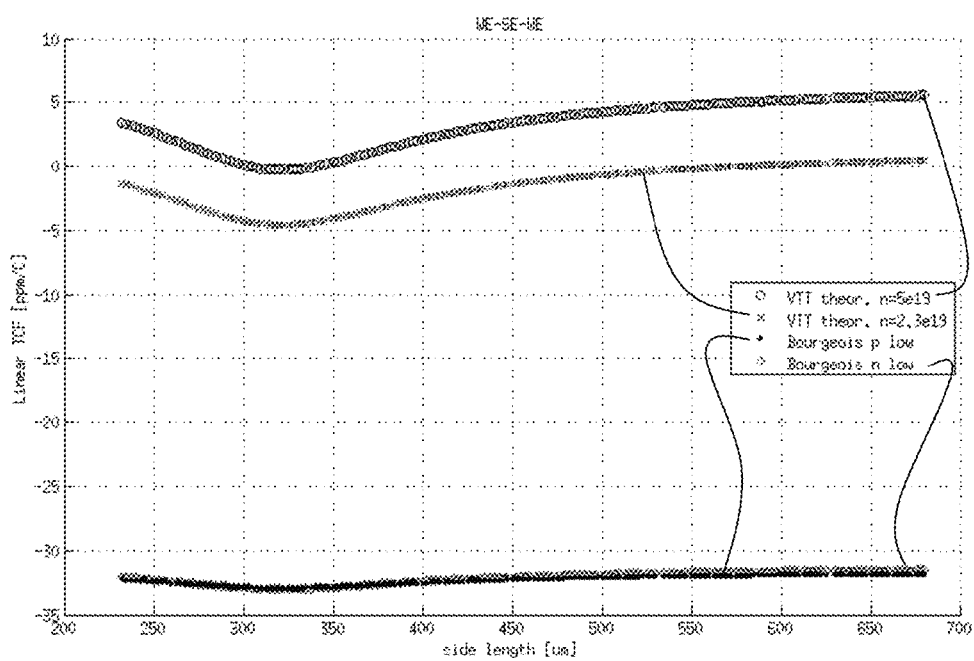

Interestingly, the WE mode is more susceptible to temperature compensation by n-doping than the SE-mode. FIG. 10*b* shows the simulated TCFs of the resonance modes, which evolve from WE mode to SE mode, and again back to WE mode, as one side of the resonator is changed from 230 µm to 680 µm and the other side is kept at 320 µm. The SE mode at side length of 320 µm has the lowest TCF, and TCF is increased as the side length aspect ratio departs from 1. The graph suggests a WE mode can be temperature compensated at an n-dopant concentration of about 2.3*10$^{19}$ cm$^{-3}$, when the ratio of the sides is more than 2:1.

Beam Resonators

Approximation of the Frequency Vs. Elastic Matrix Elements Relationship of the Extensional/Flexural Resonance of a Beam Resonator The Young's modulus for one dimensional stretching/shrinking of an element of a material is given by Y1D=T/S, where T is the stress along the stretching/shrinking direction and S is the related strain. We assume that no stresses affect the material element in the directions that are perpendicular to T. If we assume that the material has cubic crystal symmetry, the stress vs. strain relationship is given by the matrix equation [T]=[c][S], where [T] and [S] are 6×1 stress and strain matrices, respectively, and [c] is the 6×6 elastic matrix with three independent elements $c_{11}$, $c_{12}$ and $c_{44}$. Solving Y1D for stretch along the [100] crystal axes yields a result Y1D=$c_{11}-2*c_{12}^2/(c_{11}+c_{12})^2$.

The bending stiffness and the extensional stiffness of a beam are proportional to Y1D. Therefore the resonance frequency of a flexural (bending) resonance mode or an extensional resonance mode is proportional to sqrt(Y1D).

Figure 6:
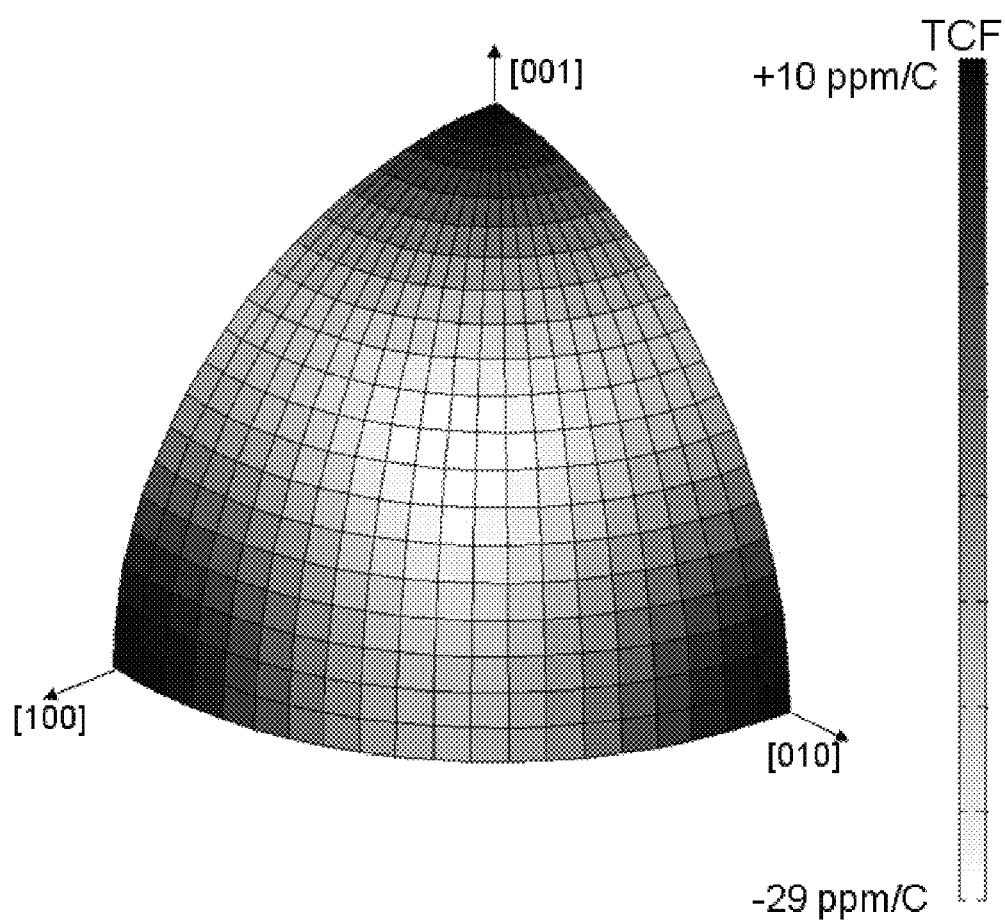
FIG. 6 illustrates the temperature coefficient of a flexural/length extensional beam resonator for all possible beam orientations relative to the silicon crystal.

Point labeled as "Y1D" in FIG. 19 indicates that extensional/flexural resonance modes belong to the class of resonance modes that can be temperature compensated with n-doping. FIG. 6 shows the value of the linear TCF calculated from Y1D in all possible crystal orientations of a cubic crystal. The calculation is based on theory and a n-dopant concentration of n=5*10$^{19}$ cm$^{-3}$ has been assumed. TCF is maximized along [100] directions. This approximative result suggests that a flexural or extensional resonance of a beam can be temperature compensated when the beam is oriented along a [100] direction, or does not remarkably deviate from a [100] direction. The simulated examples below provide further proof for this.

Torsional beams with rectangular cross sections are discussed in more detail below. However, the invention can be generalized to beams with non-rectangular cross-sections (e.g. circle or ellipse), and to even beams, whose cross section is varied along the length of the beam (e.g. a tapering beam).

Extensional Mode Beam Resonators

A beam shaped body has a length extensional resonance where the resonance is characterized by the contraction/extension of the resonator. The resonance frequency is approximately given by f=sqrt(Y1D/φ/2L, where Y1D is the Young's modulus for 1D stretch defined above, ρ is the resonator density and L is the resonator length. As suggested above the resonance can be temperature compensated by n-doping when the resonator length dimension is aligned along the [100] crystal direction (or when the deviation from the [100] direction is small). The resonator can be fabricated on any wafer plane.

Figure 11A:
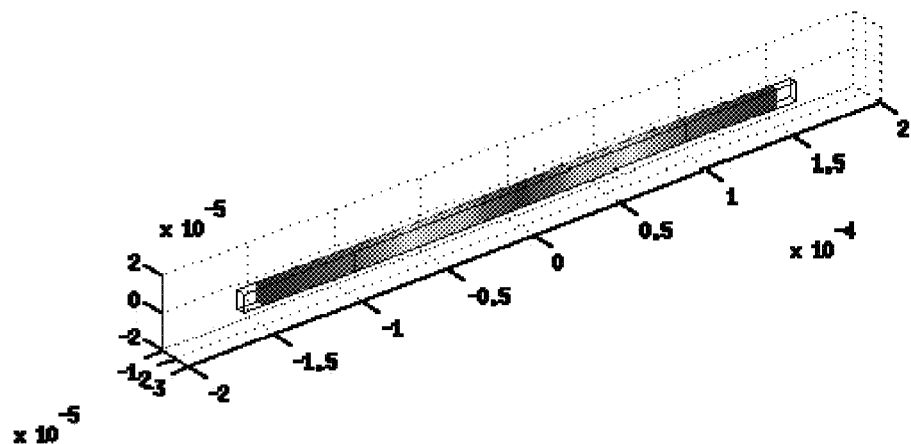

Example of a beam resonator extensional resonance mode is shown in FIG. 11*a*. The dimensions (length×width×height) of the beam are 320 µm*5 µm*10 µm.

Figure 11B:
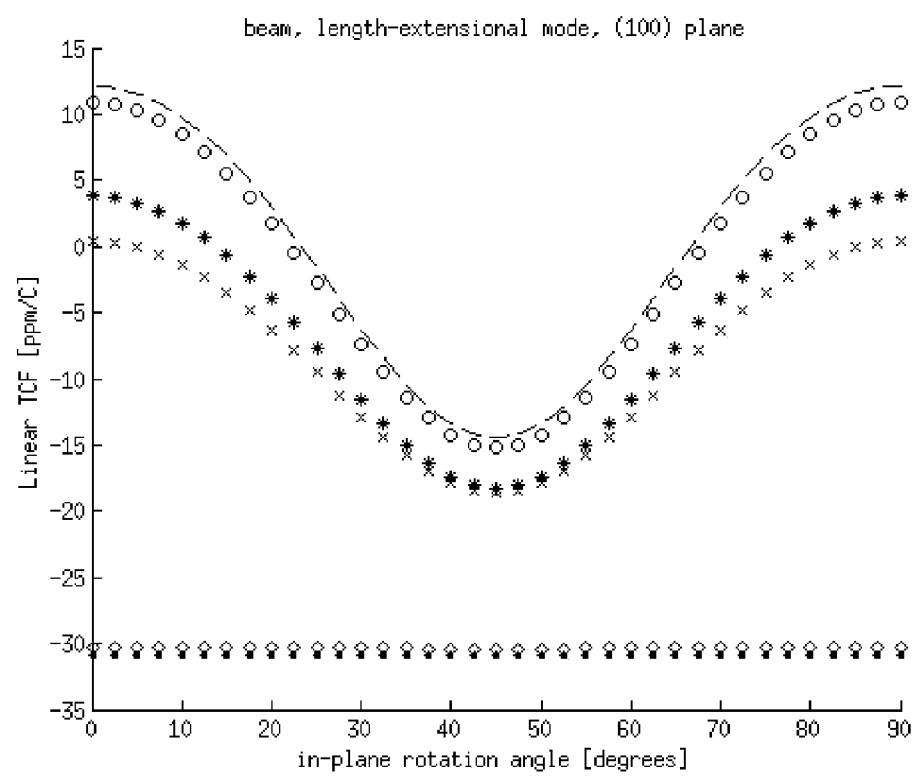
Figure 11C:
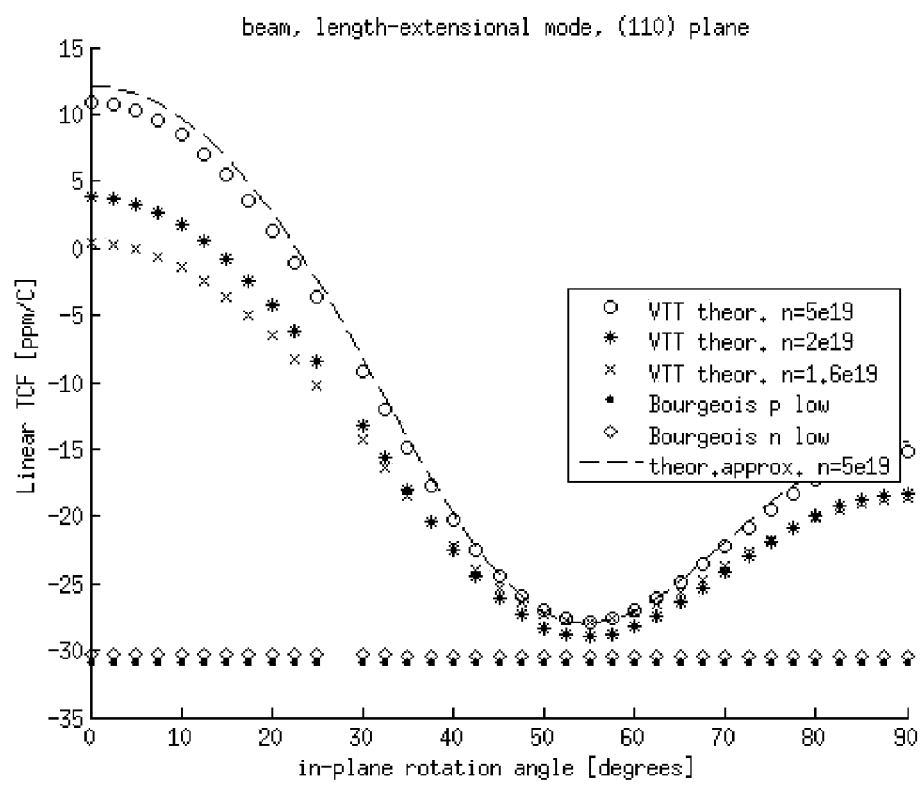

FIGS. 11*b* and 11*c* (see legend in FIG. 11*c*) illustrate how the linear TCF changes as the beam resonator of FIG. 11*a* is rotated within the plane (100) or within plane (110). For (100) plane (FIG. 11*b*) in-plane rotation angles 0 or 90 correspond to beam being aligned along [100] direction while 45 degrees corresponds to alignment with [110]. For (110) plane (FIG. 11*c*) in-plane rotation angle 0 corresponds to [100] alignment and 90 degrees corresponds to alignment with [110]. The curve labeled with "theor. approx." is the calculation based on Y1D, with elastic matrix element temperature sensitivities from the theory with n-dopant concentration n=5*10$^{19}$ cm$^{-3}$. All other data labels are as described in the above discussion related to Lamé/face shear modes.

Following observations can be made:
  For dopant concentration n=5*10$^{19}$ cm$^{-3}$ resonators aligned with the [100] direction are overcompensated with TCF >10 ppm/° C.
  For dopant concentration n=5*10$^{19}$ cm$^{-3}$ TCF is zeroed for approximately 20 degrees deviation from [100].
  For the optimal direction, near zero TCF is attained at an approximate concentration of n=1.6*10$^{19}$ cm$^{-3}$.
  The approximation based on Y1D and the simulated data agree well with each other.
  The typical silicon TCF of approximately −30 ppm/° C. is obtained with relatively low n or p doping.
  For each rotation angle between about 0 . . . 25°, there is an optimal doping concentration between about n=1.6*10$^{19}$ . . . 5*10$^{19}$ cm$^{-3}$.

Figure 12A:
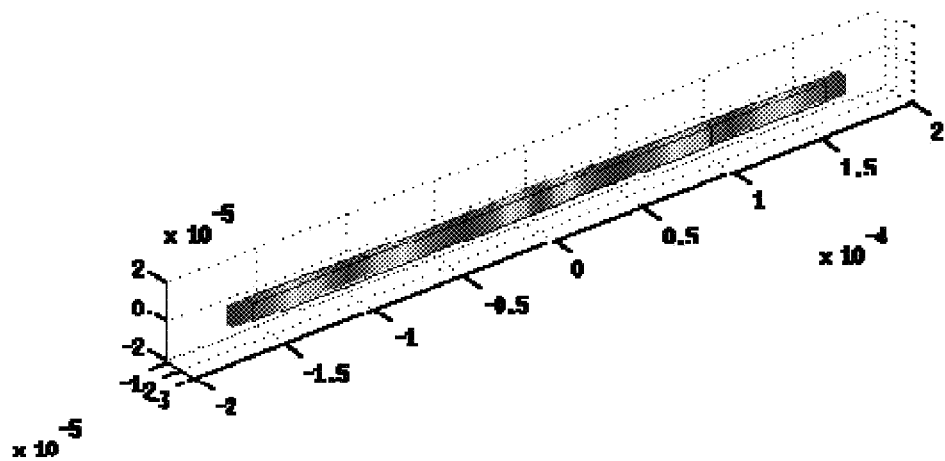

In addition to the first order length extensional mode illustrated in FIG. 11*a*, higher order length extensional modes can be temperature compensated in a similar manner. FIG. 12*a* illustrates the mode shape of the third-order extensional mode of the same resonator as discussed above.

Instead of one nodal point at the center the resonance mode has three nodal points along its length axis.

Figure 12B:
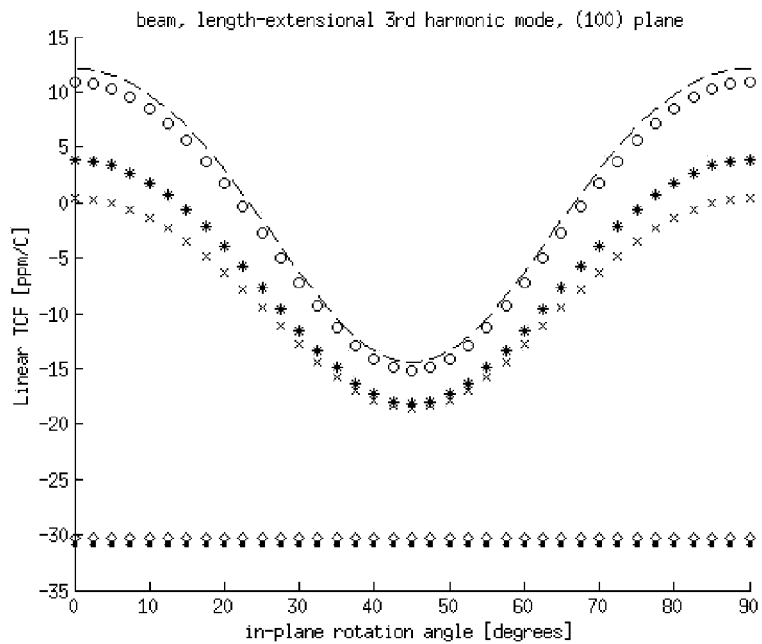
Figure 12C:
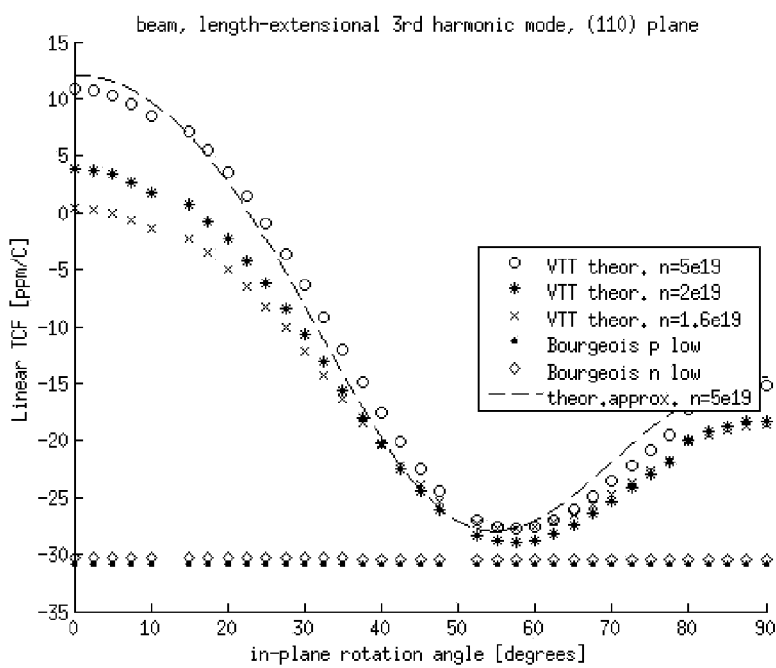

FIGS. 12b and 12c illustrate the calculated temperature coefficients for the third-order length-extensional mode. Observations are essentially similar as for the first-order length-extensional mode.

Flexural Mode Beam Resonators

A beam similar to as referred above in connection with length extensional modes can be excited also to a flexural mode (including in-plane flexure and out-of plane flexure). A flexural mode resonance is proportional to sqrt(Y1D), and therefore it can be temperature compensated by n-doping when it is aligned along the [100] crystal direction in the same manner as the length extensional resonator from the above discussion.

Figure 13A:
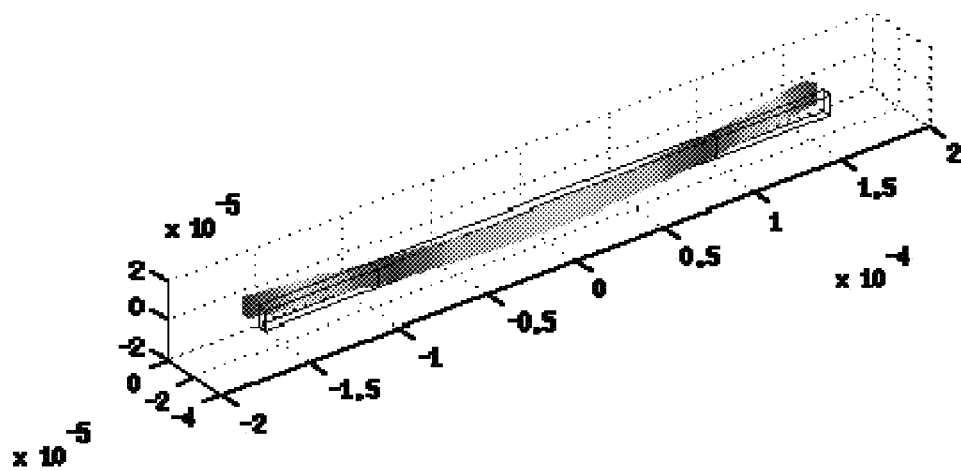

FIG. 13a illustrates the lowest-order in-plane flexural resonance mode of the beam resonator from previous examples.

Figure 13B:
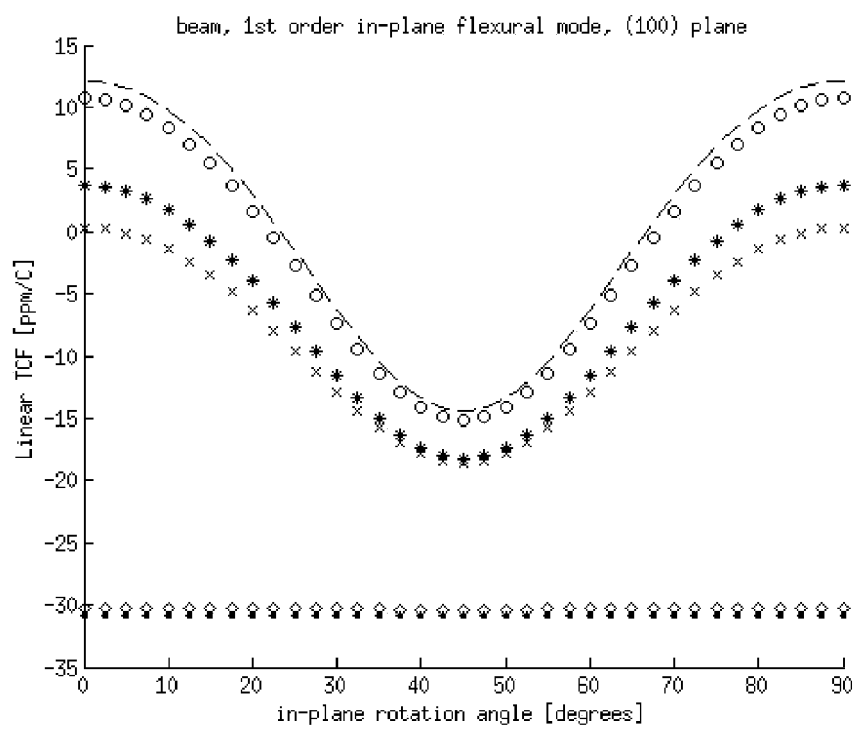
Figure 13C:
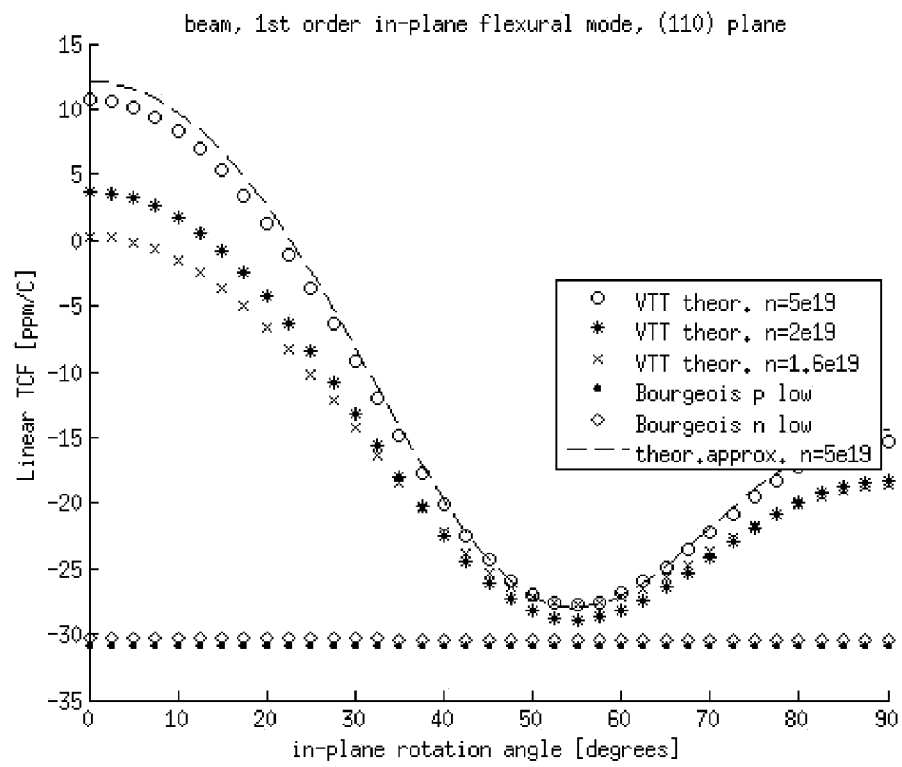

FIGS. 13b and 13c illustrate the calculated temperature coefficients for the first-order in-plane flexural mode. The results are very similar to what they were for the length-extensional resonance mode. In particular, for each rotation angle between about 0 . . . 25°, there is an optimal doping concentration between about $n=1.6*10^{19} ... 5*10^{19}$ cm$^{-3}$.

Figure 14A:
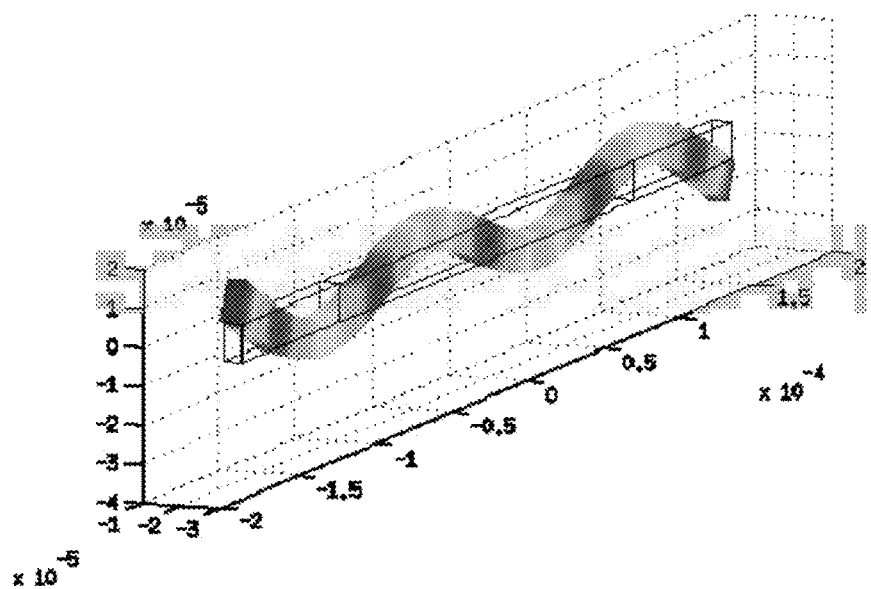

In addition to the first order flexural mode illustrated in FIG. 13a, higher-order modes can be used too. As an example of such a mode, an illustration of a higher-order out-of-plane flexural mode is shown in FIG. 14a. The resonator dimensions are again the same as in the previous examples.

Figure 14B:
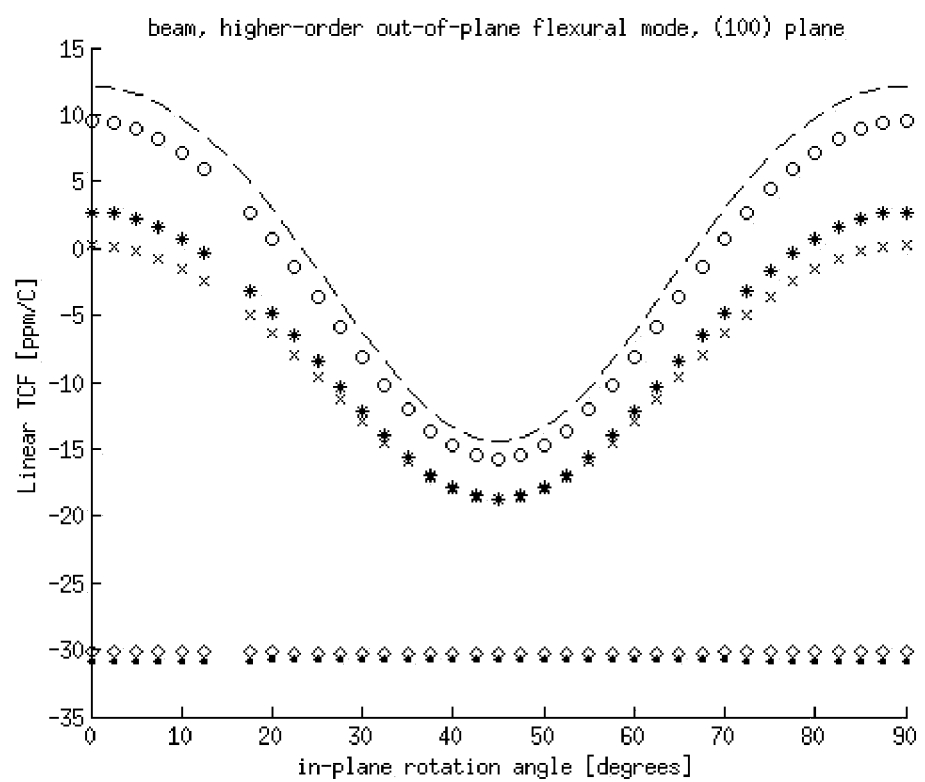
Figure 14C:
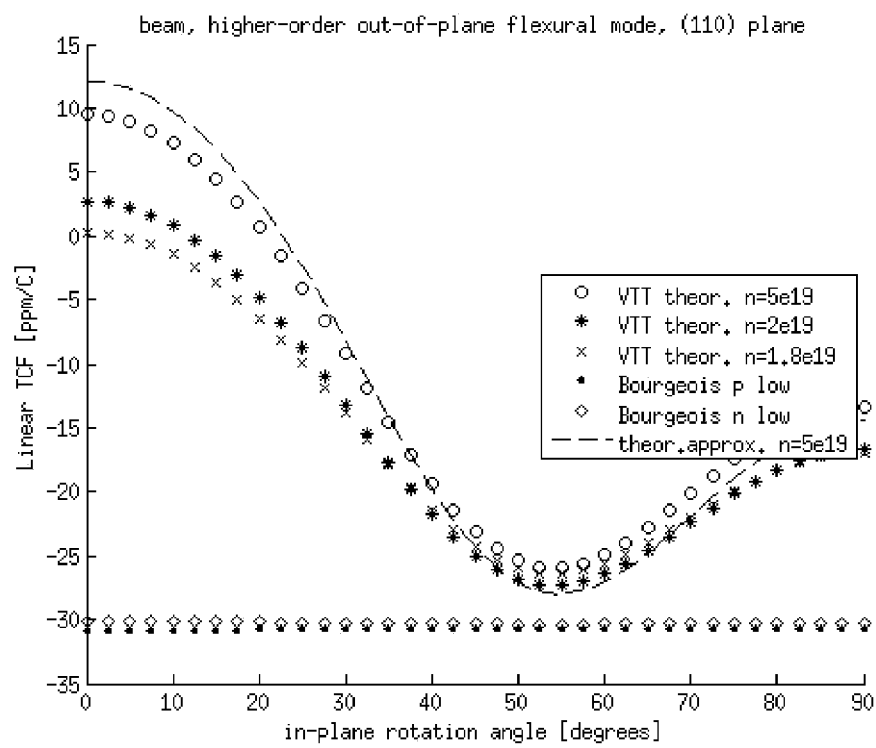

FIGS. 14b and 14c illustrate the calculated temperature coefficients for this higher-order out-of-plane flexural mode. Temperature compensation appears to work in the same manner as in the above examples. For each rotation angle between about 0 . . . 25°, there is an optimal doping concentration between about $n=1.8*10^{19} ... 5*10^{19}$ cm$^{-3}$. It can be noted that the contribution to resonance frequency from other than ($c_{11}$-$c_{12}$) terms is increased a bit for a higher-order mode, when compared to previous examples, and therefore e.g. maximum overcompensation with $n=5*10^{19}$ cm$^{-3}$ is slightly smaller. From the same reason the minimum n-dopant concentration with which TCF can be zeroed is lower: according to the simulation this lower limit is at approximately $n=1.8*10^{19}$ cm$^{-3}$.

Torsional Mode Beam Resonators

Figure 15A:
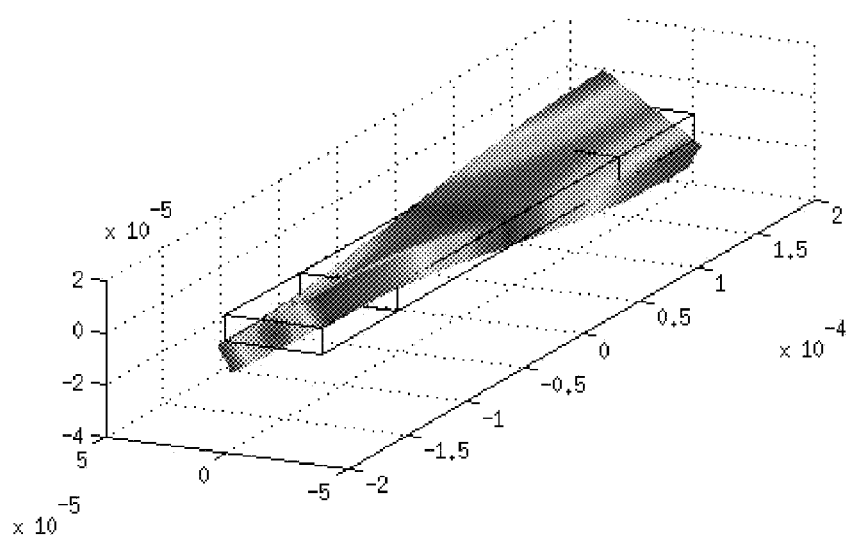

FIG. 15a shows the mode shape of a first-order torsional resonance of a beam with dimensions (length*width*height) of 320 μm*40 μm*10 μm. The torsion axis is defined by the length dimension of the beam. A torsional resonance is strongly dependent on ($c_{11}$-$c_{12}$) when the torsion axis is oriented along the [110] axis and the larger of the beam cross section dimensions is also oriented along [110] (this ties the smaller cross section dimension to be aligned with [100]).

Figure 15B:
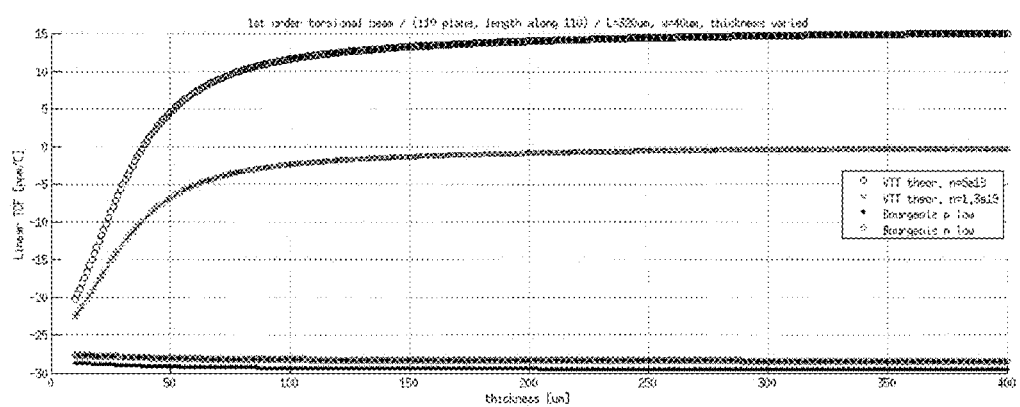
Figure 15C:
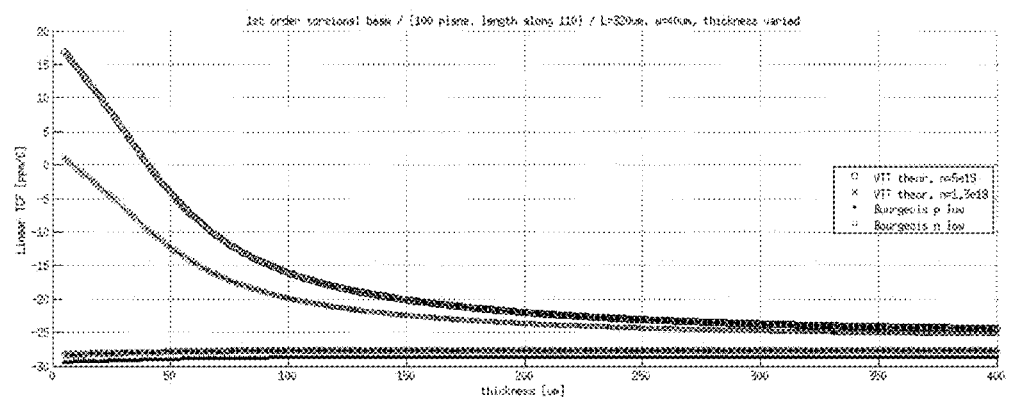
Figure 15D:
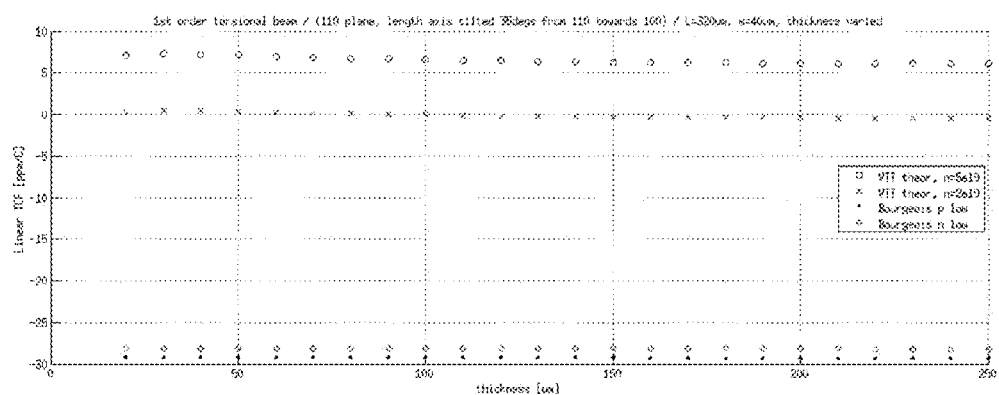

Conditions for the torsional beam cross section aspect ratio and the needed n-doping concentration are more accurately quantified by simulation results presented in FIGS. 15b, 15c and 15d, where the TCF of the first order torsional mode at different n-dopant concentration levels has been simulated as a function of the thickness of beam (length and width of the beam being identical to that in FIG. 15a).

FIG. 15b shows the simulation result for the beam that is fabricated on a 110-plane so that its length is along the [110] direction.

FIG. 15c shows the simulation result for the beam that is fabricated on a 100-plane so that its length is along the [110] direction.

FIG. 15d shows the simulation result for the beam that is fabricated on a 110-plane so that its length is along the direction that is obtained by rotating the beam within the plane by 35 degrees from the [110] direction towards [100].

Observations are:
  In cases shown by FIGS. 15b and 15c TCF=0 is attained at n-dopant concentration $n=5*10^{19}$ cm$^{-3}$ at approximately the thickness of 40 microns, which is the case at which beam thickness is equal to beam width. Thus, temperature compensation is possible
    for beam fabricated to (100) plane, whose length is along [110] direction and whose width is larger than, or approximately equal to, the height (thickness)
    a beam fabricated to (110) plane, whose length is along [110] direction and whose height (thickness) is larger than, or approximately equal to, the width.
  FIGS. 15b and 15c indicate that the lowest n-dopant concentration at which temperature compensation still is possible (with extreme cross sectional aspect ratios) is approximately $n=1.3*10^{19}$ cm$^{-3}$.
  FIG. 15d shows that for a beam fabricated to (110) plane there is an intermediate angle, at which the TCF dependence on the beam cross section aspect ratio is minimized. This direction appears to be 20-50 degrees, in particular near 35 degrees tilt from the [110] direction towards [100]. TCF being independent of the cross-sectional aspect ratio is advantageous in practice since it provides robustness against process variations and allows more freedom for the device designer (e.g. a device may contain multiple torsional springs with different cross sectional aspect ratios, and all those springs have similar effect to the TCF).

Simulations were done at 5 degree steps, and the cases with 30/40 degrees tilt were inferior to the presented case. Optimal tilt direction is expected to occur between 33 and 37 degrees. Importantly, an intermediate angle producing similar aspect-ratio independence is not found for beams fabricated to the (100) plane.

In addition to the first order torsional mode illustrated in FIG. 15a, and discussed in the context of FIGS. 15b-d, TCF behavior of higher-order torsional modes is of similar character, and can be used as well.

Generalizations and Variations

The abovementioned principles and resonator structures can be applied in various ways in order to achieve more complex resonator entities. Thus, the geometry of the resonator can be designed to meet the needs of a particular application and still the temperature compensation be adjusted to the desired level. For example, additional mass-loading elements can be brought to plate or beam resonators in order to adjust the resonance frequency of the resonator. Flexural-mode mass-loaded resonators per se are more extensively discussed in the Finnish patent application No. 20105851 of the same applicant.

Any compound resonator, which can be divided into mass element(s) and spring(s) can be temperature compensated with n-doping, when the resonance mode is such that the at least some of the spring(s)
  experience extension or bending (flexure), and simultaneously the springs and their orientation with respect to the crystal fullfill the conditions presented above in the context of extensional/flexural mode beam resonators,
  experience torsion, and simultaneously the spring(s) and its/their dimension(s) fullfill the conditions presented above in the context of torsional mode beam resonators.

It should be noted that a compound resonator may contain of multiple springs, and the individual springs may independently experience extension, bending or torsion.

Figure 16:
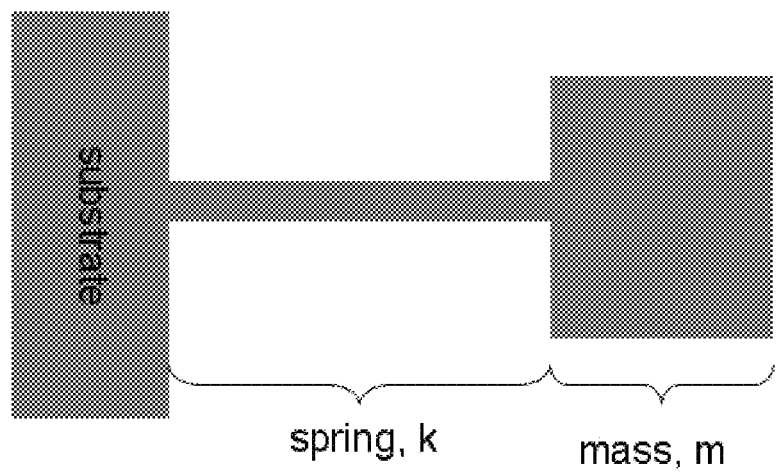
FIG. 16 shows an exemplary compound resonator.

FIG. 16 shows a simple exemplary compound resonator design, which can be divided into a spring and a mass. This system has resonance modes, where the spring experiences extensional, flexural or torsional oscillation, and, therefore these resonance modes may be temperature compensated by n-doping when the spring alignment with the crystal and the spring dimensioning are selected correctly: For extensional/flexural modes the sufficient condition (assuming a correct level of doping) is that the main axis of the beam is oriented along the [100] crystal direction, for torsional modes the orientation conditions are more stringent as discussed above.

Discussion in chapter Shear mode plate resonators was restricted to (pseudo) Lamé modes and (pseudo) face-shear modes of square plate resonators. As appreciated by a skilled person, the resonator body does not have to be of square shape to be able to resonate in a shear mode whose frequency would be ($c_{11}$-$c_{12}$)-characterized. For example, the so called Wine glass resonance mode of a circular resonator plate is a ($c_{11}$-$c_{12}$)-characterized shear mode that can be temperature compensated. Even further, allowing the geometry to deviate from the perfect square or disk shapes to more asymmetric geometries gradually changes the strongly ($c_{11}$-$c_{12}$)-characterized shear modes to modes with weaker ($c_{11}$-$c_{12}$) dependence, which, however, due to the overcompensation capability with n-doping can still be temperature compensated with a suitable n-dopant concentration.

In general, although such modifications can bring non-idealities to the system and decrease the temperature compensation effect of n-doping of the resonator element with respect to simple geometries, the desired compensation level may still be well achievable due to the overcompensation capability with n-doping.

Optimization and Practical Implementations of n-Doped Resonators

As is apparent from the above discussion, many resonators designs can be overcompensated with the aid of the invention. This fact indicates that there is some "slack" to trade off when optimizing the resonator overall performance. The aim typically is to have the overall temperature compensation close to zero. This could be achieved, for example, by optimizing the frequency vs. temperature behavior by:
- Adjusting the doping concentration of the n-dopant suitably,
- Inclusion of additional dopants, typically to a total amount of less than 50%, in particular 1-49%, typically less than 30%, of the number of all dopant atoms. The additional dopants may be of n- or p-type, or both.
- Choosing the angle of the resonator element with respect to the silicon crystal suitably. Any deviation from the optimal angle will cause the TCF to drop. Thus, by deviating overcompensated resonators from the optimal direction axis (typically by rotating the resonator at the lateral plane) the TCF can be adjusted to the desired level. Rotation angle may be e.g. ±1°–30°.
- Providing to the resonator structure additional parts, optionally with negative TCFs. Thus, the overall TCF of the resonator could be tuned to zero by suitable selection of the materials and the resonator design. The additional parts may comprise, for example, additional mass elements which are part of the resonator element, or anchors or transducer elements generally not considered to be part of the resonator element. A piezoactuated SE resonator and a Lamé resonator array described in more detail below are examples of such design.

Special Features

As discussed in our previous patent application PCT/FI2010/050935, the effect of manufacturing tolerances of BAW resonators can be minimized by providing at least one void to the resonanor element. In FEM simulations it has been found that a central void provided to an n-doped resonator can also increase the TCF of the resonator. For example, in the case of a SE mode square plate resonator of dimensions 320×320×10 μm³, over +2 ppm/° C. increase in TCF was observed, when a central void of 100 micrometers diameter was created in the center of the plate (assuming n-dopant density of $5*10^{19}$ cm$^{-3}$). Similar behaviour can be expected for other modes, too.

Consequently, according to one aspect of the invention, the n-doped resonator element comprises at least one void, typically in the form of a recess or through-hole in the resonator element. Preferably, the void is in the form of a closed-loop trench. Typically, the void is provided in the middle of the resonator element but it may also be located in non-central position or there may be an array of symmetrically or non-symmetrically arranged voids.

According to another aspect of the invention, the anchors of the resonator plate are designed to be beams that have a considerable influence on the temperature compensation properties of the resonator. In this context, the term "considerable influence" means that they affect the TCF of the resonator by at least 2 ppm/° C.

According to one still another aspect, the resonator device comprises at least two separate resonator elements which have a TCF difference, preferably of the order of 30-50 ppm/° C. At least one or both of the resonator elements may by n-doped. According to a preferred embodiment, both resonator elements are n-doped, typically with the same concentration, but their crystal orientations differ by 45°. For example, there could be two Lamé resonators, one having a TCF of −30 ppm/° C. and the other a TCF of +18 ppm/° C. Measurement of both of the two resonator elements can be used for temperature compensation utilizing the TCF difference. This kind of method is disclosed in more detail in U.S. Pat. No. 7,145,402.

Theoretical Model for TCF of a Resonator

The frequency of a resonator can be given in a generalized form by $$f = \frac{1}{L} \times \sqrt{\frac{c}{\rho}},$$

where c is the generalized stiffness of the material (which takes into account the resonance mode, resonator geometry and its orientation with respect to crystal), ρ is the material density and L is the generalized dimension of the resonator.

When the temperature changes the resonance frequency changes due to change in material parameters and in the dimensions of the resonator. The temperature coefficient of the resonance frequency $$TC_f = \frac{1}{f} \frac{df}{dT}$$

depends on material parameters on the following way:

$$TC_f = TC_v - \alpha,$$

where α is the linear coefficient of thermal expansion taking into account the elongation of the resonator and TC of acoustic velocity is $$TC_v = \frac{1}{v}\frac{dv}{dT} = \frac{1}{2}(TC_c - TC_\rho) = \frac{1}{2}(TC_c + 3\alpha),$$

leading to $$TC_f = \frac{1}{2}(TC_c + \alpha)$$

Usually the clearly dominating effect is the first term, i.e. thermal coefficient of stiffness $TC_c$, whereas thermal expansions effect is much smaller. If one is able to modify $TC_c$ of the resonating material strongly enough, temperature stable resonators can be realised. The following experimental verification of the model shows that by heavy n-doping of silicon this can be achieved.

Theoretical Model for the Stiffness Matrix Element Temperature Sensitivities

To further demonstrate the feasibility and to understand the operation of the invention, the authors have developed a theoretical model. The model utilizes the free electron contribution to the elastic constants of silicon using the many-valley approach by Keyes (R. W. Keyes, Solid State Physics, Vol. 20, 1967). The model contains a single fitting parameter, the deformation potential. The deformation potential parameter was fitted to the data published by Hall ("Electronic Effect in the Elastic Constants of n-Type Silicon", Physical Review, vol 161 (2), pp. 756-761, 1967) using the data points at temperature range T=100 . . . 308 K.

Figure 17A:
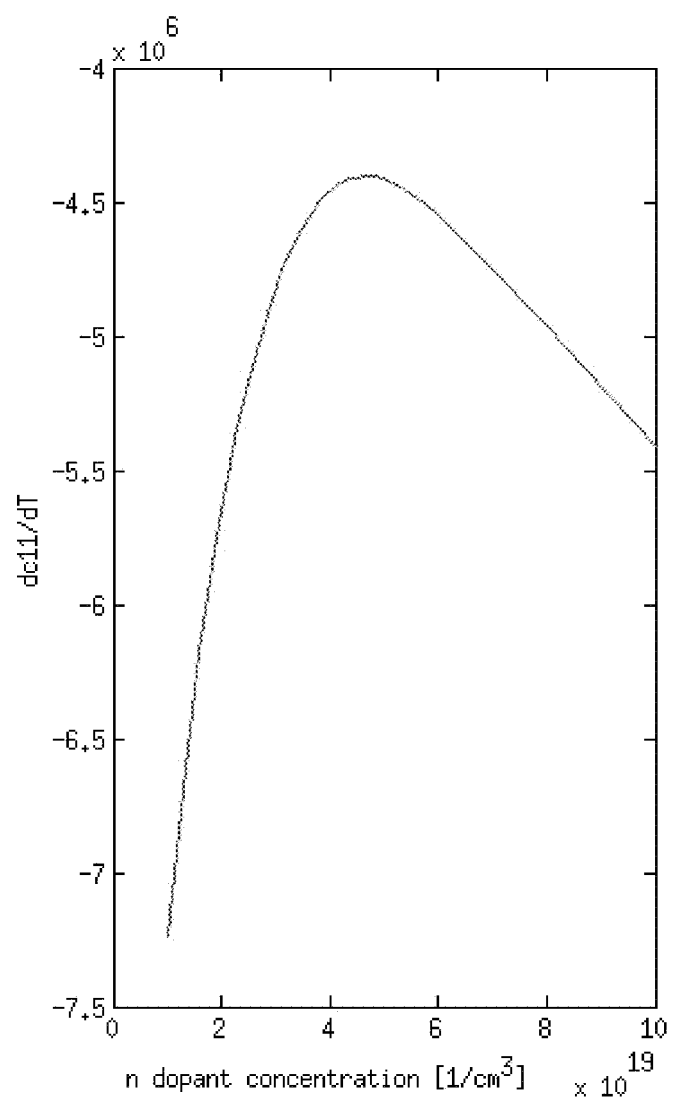
FIGS. 17a-17c show the silicon elastic constant $c_{11}$, $c_{12}$ and $c_{44}$ sensitivities as a function of n-dopant concentration.
Figure 17B:
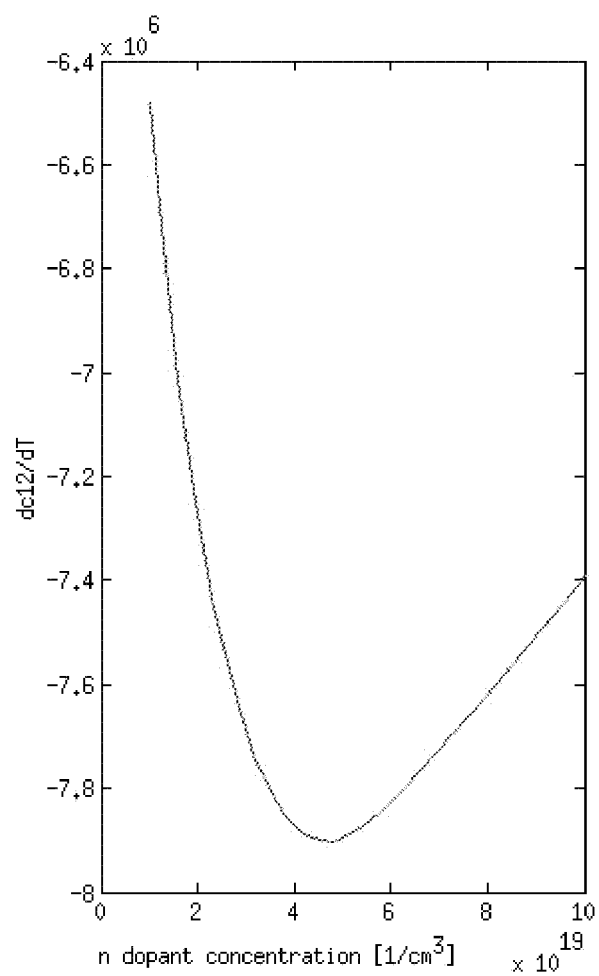
Figure 17C:
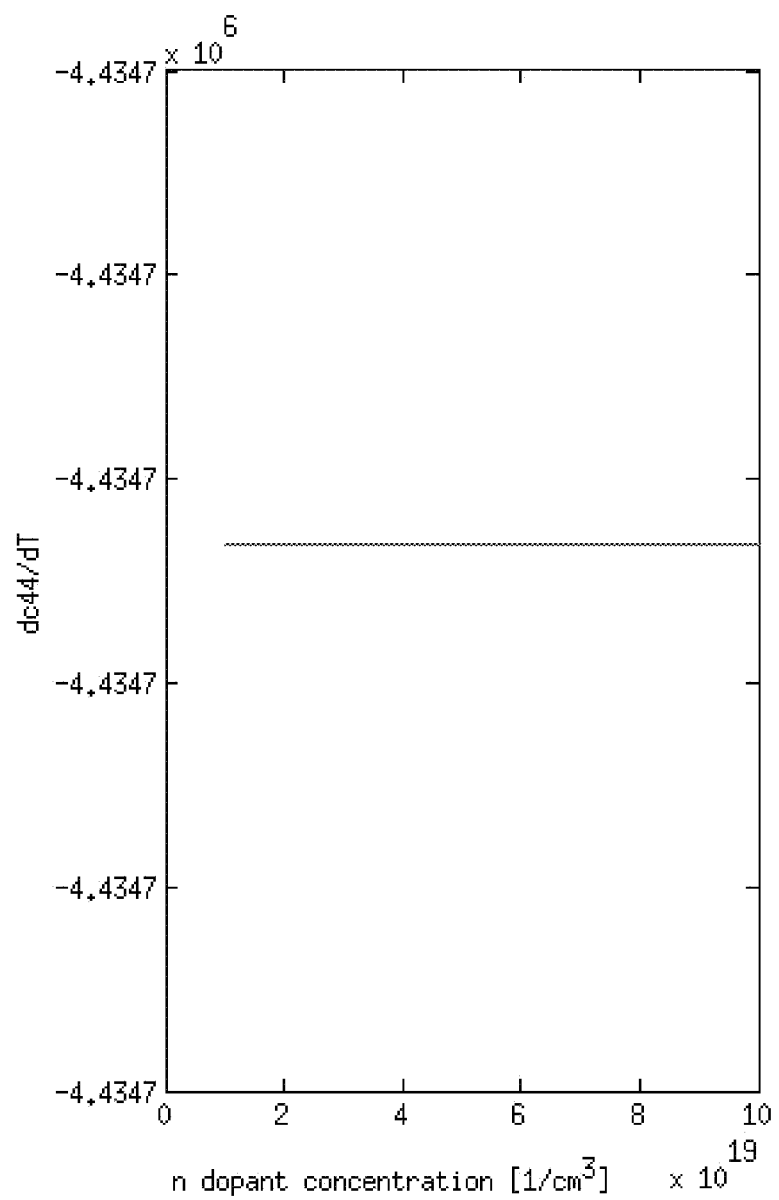

FIGS. 17a-c show the temperature sensitivities of the elastic matrix parameters for n-dopant level $n=0.5*10^{19}$ cm$^{-3}$ . . . $10*10^{19}$ cm$^{-3}$ ($dc_{ij}/dT$ units are in Pa/C). It was assumed that in case of n-doping, the sensitivity of the $c_{44}$ elastic matrix term is unaffected and the data provided by Hall was used for estimating the $c_{44}$ temperature sensitivity. For $c_{11}$ and $c_{12}$, temperature sensitivities were obtained from this theory.

The theory, as applied on the present inventive structure and bulk acoustic wave modes was found to agree with experimental data at a reasonably good level (see experimental section below). When TCFs have been calculated using the theory results it has always been assumed that the thermal expansion coefficient is that of normal (non-doped or weakly doped) silicon, i.e., α=2.6 ppm/° C. in the general TCF theory above.

Definition of $c_{11}$-$c_{12}$ Characterized Modes

The expressions that the "frequency of a particular resonance mode is characterized or dominated by matrix element terms ($c_{11}$-$c_{12}$)", or "mainly dependent on $c_{11}$-$c_{12}$" are clarified in the following.

The theoretical model presented in above is able to predict the elastic constant temperature sensitivities $dc_{ij}/dT$ as a function of the n-dopant concentration. For minimizing the temperature dependence of a resonator it would be desirable that the temperature sensitivity of a constant would be zero at some dopant concentration level. This appears not to be the case for the constants $c_{11}$, $c_{12}$ and $c_{44}$, but, when investigating the difference of the terms $c_{11}$ and $c_{12}$ we see that the sensitivity $d(c_{11}$-$c_{12})/dT$ is zero at the dopant concentration of approximately $n=1.2*10^{19}$ cm$^{-3}$, see FIG. 18.

This result suggests that it is possible to temperature compensate a resonator, if the resonator geometry, its orientation with respect to the crystal, and the resonance mode in question is such that the generalized stiffness (see chapter Theoretical model for TCF of a resonator) c is proportional to $c_{11}$-$c_{12}$. Such a mode is, for example, the Lamé mode of a plate resonator.

By "c is proportional to $c_{11}$-$c_{12}$" is meant the following: Assume that the generalized stiffness c can be expressed as a linear polynomial, $c=P*c_{11}+Q'*c_{12}+R*c_{44}$, where P, Q' and R are constants. The polynomial may be refactored as:

$$c=P*(c_{11}-c_{12})+Q*c_{12}+R*c_{44} \quad [\text{eq1}],$$

where the new constant we have Q=Q'+P.

By "generalized stiffness c proportional to $c_{11}$-$c_{12}$" is meant that constant P is nonzero and that Q=R=0.

Figure 18:
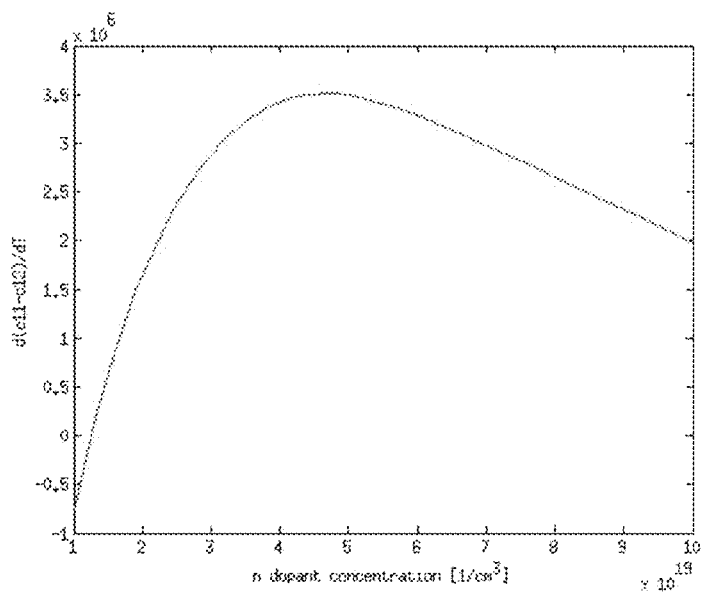
FIG. 18 shows the silicon elastic matrix term $c_{11}$-$c_{12}$ sensitivity as a function of n-dopant concentration.

However, the temperature compensation property can be applied to a wider class of resonators than to just those for which the above discussed strict condition is fulfilled. As shown in FIG. 18, the sensitivity $d(c_{11}$-$c_{12})/dT$ attains positive values at concentrations above $n=1.2*10^{19}$ cm$^{-3}$. At the same time, $dc_{12}/dT$ and $dc_{44}/dT$ stay negative (see chapter Theoretical model for TCF of a resonator). Therefore, it is possible to temperature compensate a resonance mode, whose generalized stiffness c equation has nonzero Q and R factors: the positive effect from $d(c_{11}$-$c_{12})/dT$ is cancelled out from contribution(s) from $dc_{12}/dT$ and/or $dc_{44}/dT$ for a resonator with a suitable mode and orientation with the crystal and an optimal n-dopant concentration. Such "non-pure" ($c_{11}$-$c_{12}$)—modes are, e.g., the flexural and extensional resonance modes of a beam resonator. Detailed examples are presented elsewhere in this document.

In general, the generalized stiffness c of a resonance mode does not have to be a linear function of $c_{ij}$'s—typically for non-pure shear modes the function is not linear (see Approximation of the frequency vs. elastic matrix elements relationship of the extensional/flexural resonance of a beam resonator). Since the relative changes of stiffness $dc_{ij}/c_{ij}$ are always small for in the context of this invention, a linear expansion of the generalized stiffness can be used (linear expansion is done at the point $[c_{11}, c_{12}, c_{44}]=[166, 64, 80]$ Gpa, which represents the stiffness terms of ordinary (essentially non-doped) silicon, can be used since the absolute value of silicon stiffness is not greatly affected by doping). The polynomial approximation for the generalized stiffness change dc can be written as $$dc=P*(dc_{11}-dc_{12})+Q*dc_{12}+R*dc_{44}.$$

The frequency of a resonator is proportional to sqrt(c) (see Theoretical model for TCF of a resonator). Because of the small magnitude of the relative changes $dc_{ij}/c_{ij}$, and that of the generalized stiffness dc/c, we can linearize the relation for the frequency change as well and obtain $$df=(\text{constant})*(P*(dc_{11}-dc_{12})Q*dc_{12}R*dc_{44}),$$

which has a factor of the same polynomial form as has been described above.

When expressed in terms of the temperature sensitivities the relation reads as $$df/dT=(\text{constant})*(P*d(c_{11}-c_{12})/dT+Q*dc_{12}/dT+R*dc_{44}/dT).$$

A mode that can be temperature compensated has df/dT >=0 at some n-dopant concentration level. A condition for a resonance mode that can be temperature compensated is thus given by the linear inequality $$d(c_{11}-c_{12})/dT+Q/P*dc_{12}/dT+R/P*dc_{44}/dT \geq 0.$$

A numerical estimate can be derived: from FIG. 18 we find the maximum value $[d(c_{11}-c_{12})/dT]_{max}=3.5$ MPa/C, and from FIGS. 17b and 17c the following minimum values are found: $[dc_{12}/dT]_{min}=-7.9$ MPa/C and $[dc_{44}/dT]=-4.4$ MPa/C. Defining $x=Q/P$ and $y=R/P$ the inequality is cast into form $$y \leq -7.9/4.4*x+3.5/4.4 \text{ or approximately } y \leq -1.8*x+0.8.$$

Assuming an error margin of 5% to the values calculated by the (see Theoretical model for TCF of a resonator) we arrive at inequality $$y \leq -1.8*x+1.$$

Thus, all points (Q/P, R/P) that fall under the line $-1.8*x+1$ represent modes that can be temperature compensated.

In conclusion, a mode can be temperature compensated with n-doping, when its linearized frequency change df (as a function of the changes of matrix elements $dc_{ij}$), which can be written as $$df=P*dc_{11}+Q'*dc_{12}+R*dc_{44},$$

or $$df=P*(dc_{11}-dc_{12})+Q*dc_{11}+R*dc_{44},$$

where $Q=Q'+P$
has coefficients P, Q and R, which fulfill the inequality $R/P<-1.8*Q/P+1$.

FIG. 19 shows where the modes discussed in connection with the various embodiments are located in the (Q/P, R/P)-plane. The modes that can be temperature compensated fall into the shaded region. Label "Y1D" refers to the approximation for the flexural/extensional mode of a beam, when the beam is oriented along the [100] direction (see Approximation of the frequency vs. elastic matrix elements relationship of the extensional/flexural resonance of a beam resonator).

Experimental Verification

The effect of homogeneous n-doping on single-crystal silicon MEMS resonator temperature coefficients has been experimentally tested. Plate resonators were fabricated on SOI wafers, whose device layer was n-doped with phosphorus to concentration of $\sim 5 \times 10^{19}$ cm$^{-3}$. Devices were characterized at temperature range of T=40 . . . 80° C., and the temperature vs. resonance frequency curves were extracted.

A total of four different resonance modes in two different resonator types were characterized. The tested resonator types were
- plate resonator of dimensions (length×width×height) 320 μm*320 μm*10 μm with plate sides aligned with [100] directions, fabricated on (100) silicon wafer, and
- similar resonator as above but rotated 45 degrees in the plane, i.e. with sides aligned with the [110] directions.

For both resonator types the square extensional resonance mode and the Lamé resonance mode were characterized.

The frequency vs. temperature data from the measurements are shown in FIGS. 3a, 3b, 4a and 4b, and the extracted linear TCFs are summarized in Table 1 along with the predictions from theory.

TABLE 1

|  | SE 110 aligned | SE 100 aligned | Lame 110 aligned | Lame 100 aligned |
| --- | --- | --- | --- | --- |
| measured TCF, n = 5 * 10$^{19}$ cm$^{-3}$ | -6.0 | -1.0 | -29.0 | 18.0 |
| VTT theory n = 5 * 10$^{19}$ cm$^{-3}$ | -5.1 | -0.2 | -26.4 | 18.3 |

The most important observations were:
1. The Lamé-mode of an [100] aligned plate was found to be overcompensated with linear TCF ~+18 ppm/° C.
2. The SE resonance mode of a [100] aligned plate had near-zero TCF of -1 ppm 1° C.
3. The TCF of the Lamé-mode of an [110] aligned plate was very little modified by n-doping.
4. The predictions from the theory presented herein appear to have a good agreement with the experimental data.

It can be seen that the graphs are not fully linear but there is a noticeable second-order term (constant "b") present. It is expected that the curves can be linearized by e.g. using additional dopant in the silicon crystal.

The description of embodiments, theory and experiments above and the attached drawings are for illustrative purposes only and are not intended to limit the invention, whose scope is defined in the following claims. The claims should be interpreted in their full scope taking equivalents into account.

The invention claimed is:

1. A micromechanical bulk acoustic wave (BAW) device comprising
   an oscillating or deflecting element which is a resonator element made of semiconductor material comprising n-type doping agent, and
   an excitation or sensing means functionally connected to said resonator element and comprising transducer means for exciting a resonance mode to the resonator B element,
wherein the oscillating or deflecting element is essentially homogeneously doped with said n-type doping agent having a doping concentration sufficient to set the temperature coefficient of frequency (TCF) of the resonator to ≥-5 ppm/° C. at 25° C.

2. The micromechanical device according to claim 1, wherein the oscillating or deflecting element comprises the n-type doping agent in an average concentration of at least $1.0*10^{19}$ cm$^{-3}$.

3. The micromechanical device according to claim 1, wherein the minimum dimension of the oscillating or deflecting element is 5 μm or more.

4. The micromechanical device according to claim 3, wherein the resonator element is adapted to resonate in a length or width extensional mode or in-plane or out-of plane flexural mode and the concentration of the n-type doping agent at least $1.6*10^{19}$ cm$^{-3}$.

5. The micromechanical device according to claim 3, wherein the resonator element is a beam.

6. The micromechanical device according to claim 5, wherein the beam is manufactured
   on a 100-plane wafer or on a 110-plane wafer, the main axis of the beam being oriented along the [110] direction of the semiconductor material, or
   on a 110-plane wafer so that the main axis of the beam is along a direction that is obtained by rotating the beam within the plane by 20 to 50 degrees from the [110] direction towards the [100] direction of the semiconductor material,
and adapted to resonate in a torsional mode.

7. The micromechanical device according to claim 1, wherein the resonator element is adapted to resonate in a shear mode and the concentration of the n-type doping agent is at least $1.1*10^{19}$ cm$^{-3}$.

8. The micromechanical device according to claim 1, wherein the resonator element is adapted to resonate in a square extensional mode and the concentration of the n-type doping agent is at least $2*10^{19}$ cm$^{-3}$.

9. The micromechanical device according to claim 1, wherein the oscillating or deflecting element comprises a silicon crystal structure and the n-type doping agent is phosphorus, arsenic or antimony.

10. The micromechanical device according to claim 1, wherein the resonator element is free from pn-junctions.

11. The micromechanical device according to claim 1, wherein the doping concentration of the n-type doping agent is sufficient to set the temperature coefficient of frequency (TCF) of the resonator element to $\geq 0$ ppm/° C. at 25° C.

12. The micromechanical device according to claim 1, wherein
the resonator element comprises a body, which can be divided into at least one mass element and at least one spring, and
the resonator element is adapted to resonate in a resonance mode in which one or more springs experience torsion.

13. The micromechanical device according to claim 12, wherein the orientation of the at least one spring is along the [100] crystal direction.

14. The micromechanical device according to claim 1, wherein
the resonator element comprises a body, which can be divided into at least one mass element and at least one spring, and
the resonator element is adapted to resonate in a resonance mode in which one or more springs experience flexure and/or extension.

15. The micromechanical device according to claim 1, wherein the resonator element comprises a plate.

16. The micromechanical device according to claim 15, wherein the resonator element comprises a plate which can be divided into a plurality of similar subsquares.

17. The micromechanical device according to claim 15, wherein the resonator element is adapted to resonate in a Lame resonance mode or in a square extensional (SE) resonance mode.

18. The micromechanical device according to claim 15, wherein the resonator element comprises a rectangular plate manufactured on a 100-plane wafer, the sides of the plate coinciding with the [100] directions of the crystal of the semiconductor material of the resonator element.

19. The micromechanical device according to claim 1, wherein the resonator element is a first resonator element and wherein the micromechanical device further comprises, at least one second resonator element mechanically coupled with the first resonator element, said first and second resonator elements having different contributions to the overall temperature coefficient of frequency (TCF) of the resonator.

20. The micromechanical device according to claim 1, wherein the resonator element comprises a homogeneously doped silicon plate or beam having a thickness of at least 4 μm and at least one lateral dimension of at least 50 μm, and the transducer means is adapted to produce a shear, square extensional, width extensional or flexural plate bulk acoustic wave mode or extensional, flexural or torsional beam bulk acoustic wave mode to the resonator element.

21. The micromechanical device according to claim 1, wherein the resonator element is a beam.

22. A method of manufacturing a micromechanical bulk acoustic wave (BAW) device, comprising the steps of:
providing a semiconductor wafer comprising a homogeneously n-doped device layer,
processing the semiconductor wafer to form a resonator element from the n-doped device layer, the element being capable of deflection or oscillation,
providing excitation or sensing means functionally connected to said resonator element for exciting a resonance mode to the resonator element or sensing the resonance frequency or degree of deflection of the element
wherein the resonator element is doped with a n-type doping agent having a doping concentration sufficient to set the temperature coefficient of frequency (TCF) of the resonator element to $\geq -5$ ppm/° C. at 25° C.

23. A micromechanical device comprising
an oscillating or deflecting resonator element made of silicon having a crystal orientation that deviates less than 30° from a direction that maximizes the temperature coefficient of frequency of the device, and comprising an n-type doping agent, the resonator element being essentially homogeneously doped with said n-type doping agent, and
excitation or sensing means functionally connected to said resonator element and comprising transducer means for exciting a resonance mode to the resonator element,
wherein the resonator element is adapted to resonate in a shear mode and the concentration of the n-type doping agent is at least $1.1*10^{19}$ cm$^{-3}$.

24. The micromechanical device according to claim 23, wherein the resonator element is free from pn-junctions.

25. The micromechanical device according to claim 23, wherein the resonator element comprises a plate.

26. The micromechanical device according to claim 25, wherein the resonator element comprises a plate which can be divided into a plurality of similar subsquares.

27. The micromechanical device according to claim 23, wherein the resonator element is a first resonator element, the micromechanical device further comprising at least one second resonator element mechanically coupled with the first resonator element, said first and second resonator elements having different contributions to an overall temperature coefficient of frequency (TCF) of the resonator.

28. The micromechanical device according to claim 23, wherein said deviation of the crystal orientation of said resonator element from said direction that maximizes the temperature coefficient of frequency of the device, is achieved by rotating the resonator element from an optimal direction on the lateral plane of said resonator element.

29. The micromechanical device according to claim 23, wherein the excitation or sensing means comprise a piezoelectric thin film excitation means or electrostatic excitation means.

30. The micromechanical device according to claim 23, wherein the device is adapted to be actuated without bias current.

31. The micromechanical device according to claim 23, wherein the minimum dimension of the oscillating or deflecting element is 5 μm or more.

32. A micromechanical device comprising
an oscillating or deflecting resonator element made of silicon having a crystal orientation that deviates less than 30° from a direction that maximizes the temperature coefficient of frequency of the device, and comprising an n-type doping agent, the resonator element being essentially homogeneously doped with said n-type doping agent, and
excitation or sensing means functionally connected to said resonator element and comprising transducer means for exciting a resonance mode to the resonator element,
wherein the resonator element is adapted to resonate in a square extensional mode and the concentration of the n-type doping agent is at least $2*10^{19}$ cm$^{-3}$.

33. The micromechanical device according to claim 32, wherein the minimum dimension of the oscillating or deflecting element is 5 μm or more.

34. The micromechanical device according to claim 32, wherein the resonator element is free from pn-junctions.

35. The micromechanical device according to claim 32, wherein the resonator element comprises a plate.

36. The micromechanical device according to claim 35, wherein the resonator element comprises a plate which can be divided into a plurality of similar subsquares.

37. The micromechanical device according to claim 32, wherein the resonator element is a first resonator element, the micromechanical device further comprising at least one second resonator element mechanically coupled with the first resonator element, said first and second resonator elements having different contributions to the overall temperature coefficient of frequency (TCF) of the resonator.

38. The micromechanical device according to claim 32, wherein said deviation of the crystal orientation of said resonator element from said direction that maximizes the temperature coefficient of frequency of the device, is achieved by rotating the resonator element from the optimal direction on the lateral plane of said resonator element.

39. The micromechanical device according to claim 32, wherein the excitation or sensing means comprise a piezoelectric thin film excitation means or electrostatic excitation means.

40. The micromechanical device according to claim 32, wherein the device is adapted to be actuated without bias current.

* * * * *